(12) United States Patent
Pileggi et al.

(10) Patent No.: US 8,198,655 B1
(45) Date of Patent: Jun. 12, 2012

(54) REGULAR PATTERN ARRAYS FOR MEMORY AND LOGIC ON A SEMICONDUCTOR SUBSTRATE

(75) Inventors: Lawrence T. Pileggi, Pittsburgh, PA (US); Daniel Morris, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 308 days.

(21) Appl. No.: 12/430,410

(22) Filed: Apr. 27, 2009

(51) Int. Cl.
 *H01L 27/118* (2006.01)
(52) U.S. Cl. ......... 257/206; 257/208; 257/390; 438/587
(58) Field of Classification Search .................. 257/206, 257/208, 365, 366, 390, 391, 392; 438/587; 716/116
See application file for complete search history.

(56) References Cited

U.S. PATENT DOCUMENTS

2006/0121715 A1* 6/2006 Chang et al. .................. 438/599

OTHER PUBLICATIONS

Ball, Richard, "The promise of structured Asic," ElectronicsWeekly.com, Oct. 26, 2004, http://www.electronicsweekly.com/Articles/2004/10/26/33416/The-promise-of-structured-Asic.htm, 4 pages.
Jhaveri, Tejas, et al., "Maximization of layout printability/manufacturability of extreme layout regularity," J. Micro/Nanolith, MEMS MOEMS 6(3), Jul.-Sep. 2007, 031011, 15 pages.
Kheterpal, V., et al., "Design Methdology for IC Manufacturability Based on Regular Logic Bricks," The Design Automation Conference (DAC 2005), Jun. 13-17, 2005, Anaheim, California, ACM 1-59593-058, pp. 353-358.
Marinissen, Erik Jan., et al., "Challenges in Embedded Memory Design and Test," Proceedings of the Design, Automation and Test in Europe Conference and Exhibition (Date '05), Mar. 7-11, 2005, Munich, Germany, 6 pages.
Ran, Yajun et al., "The Magic of a Via-Configurable Regular Fabric," Proceedings of the IEEE International Conference on Computer Design, Oct. 2004, IEEE.
Taylor, Brian et al., "Exact Combinatorial Optimization Methods for Physical Design of Regular Logic Bricks," Proceedings of the 44th Annual Conference on Design Automation, Jun. 2007, pp. 344-349, ACM.
Pileggi, Larry et al., "Regular Fabrics for Nano-Scaled CMOS Technologies," International Solid State Circuits Conference, Feb. 2006.
Fritze, M. et al., "Hybrid Optical Maskless Lithography: Scaling Beyond the 45 nm Node," J. Vac. Sci. Technol. B, Nov./Dec. 2005, vol. 23, No. 6, pp. 2743-2748, American Vacuum Society.
Fritze, M. et al., "Optical Imaging Properties of Dense Phase Shift Feature Patterns," J. Vac. Sci. Technol. B, Nov./Dec. 2002, vol. 20, No. 6, pp. 2589-2596, American Vacuum Society.

* cited by examiner

*Primary Examiner* — Kiesha Bryant
*Assistant Examiner* — Mark Tornow
(74) *Attorney, Agent, or Firm* — Withrow & Terranova, P.L.L.C.

(57) ABSTRACT

An integrated circuit comprising both memory and logic wherein at least one layer of the integrated circuit is fabricated using a common grating pattern for both memory and logic is described. In one embodiment, the integrated circuit comprises a substrate, an active layer, and a gate material layer such as a polysilicon layer, and the active layer, the gate material layer, or both the active layer and the gate material layer are formed using a common grating pattern for both memory and logic. By using a common grating pattern for both memory and logic, a corresponding layer of the integrated circuit can be reliably and affordably manufactured using sub-wavelength lithography.

21 Claims, 22 Drawing Sheets

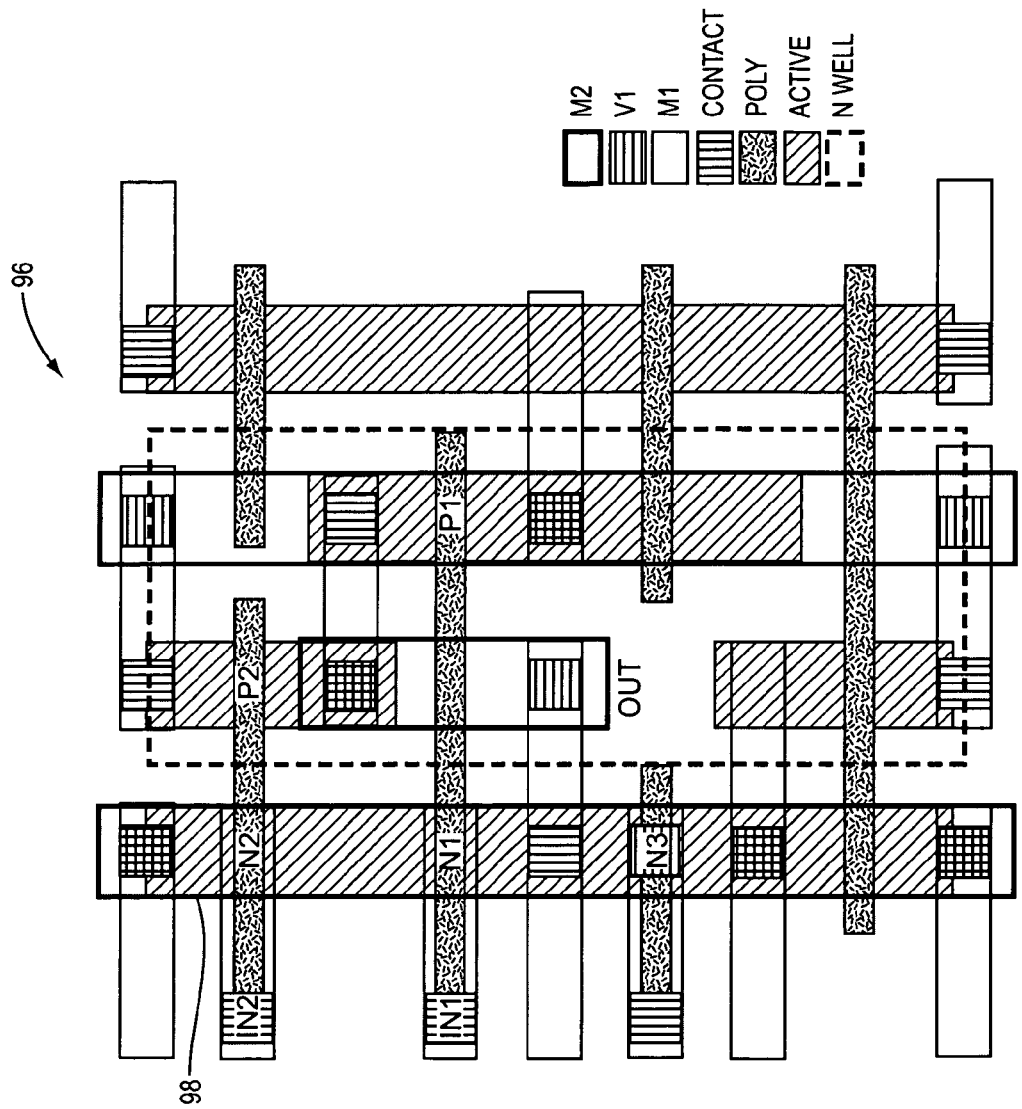
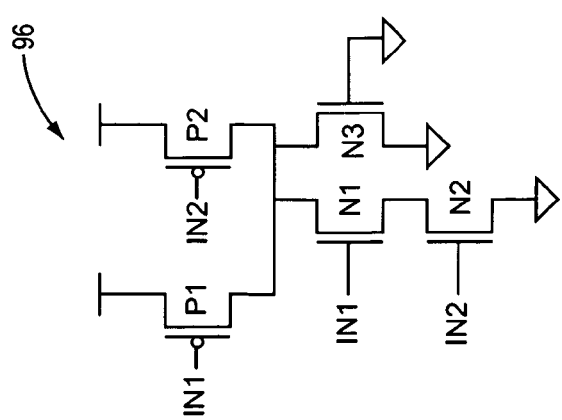
FIG. 13B
FIG. 13A

REGULAR PATTERN ARRAYS FOR MEMORY AND LOGIC ON A SEMICONDUCTOR SUBSTRATE

FIELD OF THE DISCLOSURE

This disclosure relates to an integrated circuit comprising both memory and logic and the fabrication thereof.

BACKGROUND OF THE INVENTION

In the nanoscale era of Complementary Metal Oxide Semiconductor (CMOS) scaling, the what-you-draw-is-what-you-get approach to layout and circuit design ceases to be predictable, as lithographic, etch, and stress variations affect circuit parameters. Deep sub-wavelength lithography challenges have reduced the lithographic process window and destroyed the ability to reproduce arbitrary layout patterns, thereby making systematic variability a serious impediment to continued scaling. Optical Proximity Correction (OPC) and Resolution Enhancement Techniques (RET) have stepped in to preserve printability, but these techniques have increased mask costs and have constrained the patterns that can be reproduced. Further complicating matters, in today's digital world, many integrated circuit designs require a substantial amount of both memory and logic. Thus, there is a need for an integrated circuit including both memory and logic that can be reliably manufactured using sub-wavelength lithography at reasonable cost.

SUMMARY OF THE DETAILED DESCRIPTION

This disclosure relates to an integrated circuit comprising both memory and logic, wherein at least one layer of the integrated circuit is fabricated using a common grating pattern for both memory and logic. In one embodiment, the integrated circuit comprises a substrate, an active layer, and a gate material layer such as a polysilicon layer, and the active layer, the gate material layer, or both the active layer and the gate material layer are formed using a common grating pattern for both memory and logic. By using a common grating pattern for both memory and logic, a corresponding layer of the integrated circuit can be reliably and affordably manufactured using sub-wavelength lithography.

In one embodiment, a common grating pattern and common trim, or cut, pattern are utilized for both memory and logic to form the active layer, and a common grating pattern is utilized for both memory and logic to form the gate material layer. More specifically, a common grating pattern for the active layer is formed over the substrate, where the common grating pattern for the active layer is the same for both memory and logic. Further, in one embodiment, the common grating pattern is optimized for memory. Next, the common grating pattern for the active layer is trimmed using a common trim pattern for both memory and logic. The substrate is then processed using the trimmed common grating pattern as a mask in order to form active regions of the active layer. Gate material gratings are then formed in relation to the active regions in the active layer, where the gate material gratings are formed in a common grating pattern for both memory and logic. Further, in one embodiment, the common grating pattern for the gate material layer is optimized for memory. The gate material gratings are then trimmed using different trim patterns for memory and logic such that desired transistors are defined at intersections of the trimmed gate material gratings and the active regions of the active layer. Lastly, a contact layer including a number of contacts to the memory and logic and one or more metal layers including on-chip interconnects are formed. The one or more metal layers may be formed using common metal gratings and different trim patterns for memory and logic.

In another embodiment, a common grating pattern is utilized for both memory and logic to form the active layer, and a common grating pattern is utilized for both memory and logic to form the gate material layer. More specifically, a common grating pattern for the active layer is formed over the substrate, where the common grating pattern for the active layer is the same for both memory and logic. Further, in one embodiment, the common grating pattern for the active layer is optimized for memory. Next, the common grating pattern for the active layer is trimmed using different trim patterns for memory and logic. The substrate is then processed using the trimmed common grating pattern as a mask in order to form active regions of the active layer. Gate material gratings are then formed in relation to the active regions in the active layer, where the gate material gratings are formed in a common grating pattern for both memory and logic. Further, in one embodiment, the common grating pattern for the gate material layer is optimized for memory. The gate material gratings are then trimmed using different trim patterns for memory and logic such that desired transistors are defined at intersections of the trimmed gate material gratings and the active regions of the active layer. Lastly, a contact layer including a number of contacts to the memory and logic and one or more metal layers including on-chip interconnects are formed. The one or more metal layers may be formed using common metal gratings and different trim patterns for memory and logic.

In yet another embodiment, an active layer comprising active regions formed in desired patterns for memory and logic is formed in a substrate. In this embodiment, the desired patterns for the active regions for memory and logic may be the same or different. Gate material gratings are then formed in relation to the active layer, where the gate material gratings are formed in a common grating pattern for both memory and logic. Further, in one embodiment, the common grating pattern for the gate material layer is optimized for memory. The gate material gratings are then trimmed using different trim patterns for memory and logic such that desired transistors are defined at intersections of the trimmed gate material gratings and the active regions of the active layer. Lastly, a contact layer including a number of contacts to the memory and logic and one or more metal layers including on-chip interconnects are formed. The one or more metal layers may be formed using common metal gratings and different trim patterns for memory and logic.

Those skilled in the art will appreciate the scope of the present invention and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the invention, and together with the description serve to explain the principles of the invention.

FIGS. 13A and 13B illustrate a diffusion breaking dummy transistor according to one embodiment of this disclosure.

DETAILED DESCRIPTION

The embodiments set forth below represent the necessary information to enable those skilled in the art to practice the invention and illustrate the best mode of practicing the invention. Upon reading the following description in light of the accompanying drawings, those skilled in the art will understand the concepts of the invention and will recognize applications of these concepts not particularly addressed herein. It should be understood that these concepts and applications fall within the scope of the disclosure and the accompanying claims.

Figure 1:
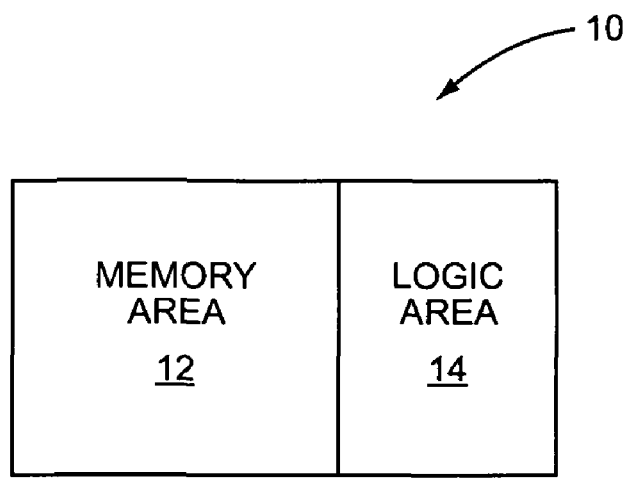
FIG. 1 illustrates an integrated circuit including both memory and logic according to one embodiment of this disclosure.

FIG. 1 illustrates an integrated circuit 10 including a memory area 12 and a logic area 14 according to one embodiment of this disclosure. The memory area 12 is an area of the integrated circuit 10 in which a number of memory devices are formed. The memory devices may be Static Radom Access Memory (SRAM) cells (e.g., 5-transistor (5T) SRAM cells, 6-transistor (6T) SRAM cells, or 8-transistor (8T) SRAM cells), Dynamic Random Access Memory (DRAM) cells, non-volatile memory such as Flash or phase-change memory, or the like. Note, however, that as used herein, "memory" refers to high-density embedded memory such as, but not limited to, those listed above (SRAM, DRAM, and non-volatile memory). As used herein, "memory" should not be construed as including sequential logic cells such as D flip flops, register files, or the like. The logic area 14 is an area of the integrated circuit 10 in which a number of logic cells are formed. The logic cells may be any type of logic cells such as, for example, NAND gates, NOR gates, inverters, or the like.

Note that the partitioning of the integrated circuit 10 illustrated in FIG. 1 is exemplary and not intended to limit the scope of the concepts discussed herein. In general, the integrated circuit 10 includes both memory and logic. Further, while the integrated circuit 10 of FIG. 1 has only one memory area 12 and one logic area 14 for simplicity and ease of discussion, the integrated circuit 10 may include any number of one or more memory areas 12 and any number of one or more logic areas 14. Still further, in an embodiment where there are multiple memory areas 12 and/or multiple logic areas 14, the memory and logic areas 12 and 14 may be interspersed among one another.

Figure 2:
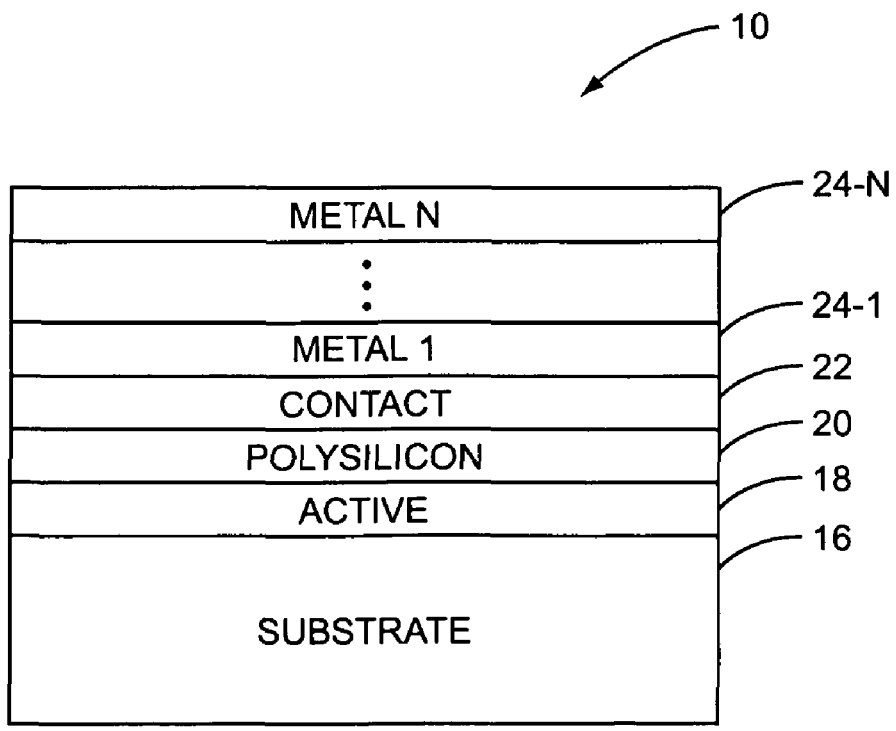
FIG. 2 illustrates layers of an integrated circuit including both memory and logic according to one embodiment of this disclosure.

FIG. 2 illustrates layers of the integrated circuit 10 according to one exemplary embodiment of this disclosure. Note that while FIG. 2 illustrates, and much of this disclosure describes, an embodiment of the integrated circuit 10 where the integrated circuit 10 is implemented as a planar device, the present invention is not limited thereto. The integrated circuit 10 may alternatively be implemented as a non-planar device such as, for example, a FinFET, a transistor having a vertical gate, or the like.

As illustrated, the integrated circuit 10 includes a substrate 16, an active layer 18, a polysilicon layer 20, a contact layer 22, and one or more metal layers 24-1 through 24-N. Note that the polysilicon layer 20 discussed and described herein is one type of gate material layer. However, as will be appreciated by one of ordinary skill in the art upon reading this disclosure, gate materials other than polysilicon may alternatively be used. Also note that the integrated circuit 10 may include additional layers not illustrated in FIG. 2 depending on the particular implementation. For instance, an insulation layer of dielectric material is generally used to separate adjacent metal layers. The substrate 16 may be any suitable substrate such as, for example, a bulk semiconductor substrate, a Silicon on Insulator (SOI) substrate including a Silicon (Si) semiconductor layer formed on an insulator, or the like.

As discussed below in detail, one or more of the layers 18 through 24-N are formed using common grating patterns for both memory and logic. Further, in one embodiment, the common grating patterns for both memory and logic are optimized for memory. This is particularly beneficial where a majority of the die area of the integrated circuit 10 is consumed by memory. Further, by using the common grating patterns, the integrated circuit 10 may be reliably manufactured using sub-wavelength lithography techniques. For example, by using the common grating patterns, the integrated circuit 10 may be reliably manufactured using a low cost grating-based double patterning technique such as, but not limited to, Gratings for Regular Arrays and Trim Exposures for ULSI Lithography (GRATEFUL) or Hybrid Optical Maskless Lithography (HOMA).

Figure 3:
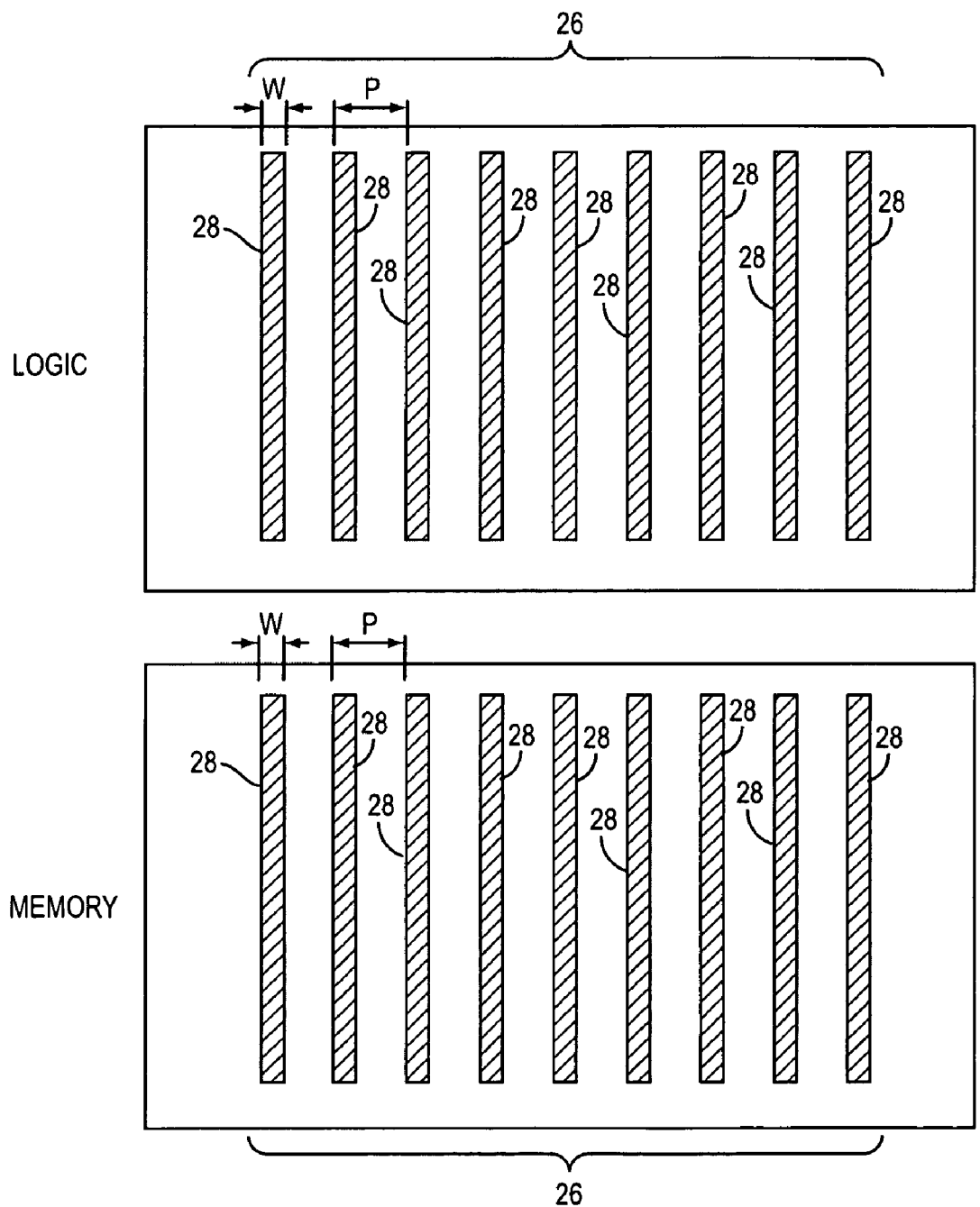
FIG. 3 illustrates an exemplary common grating pattern for both memory and logic according to one embodiment of this disclosure.
Figure 4:
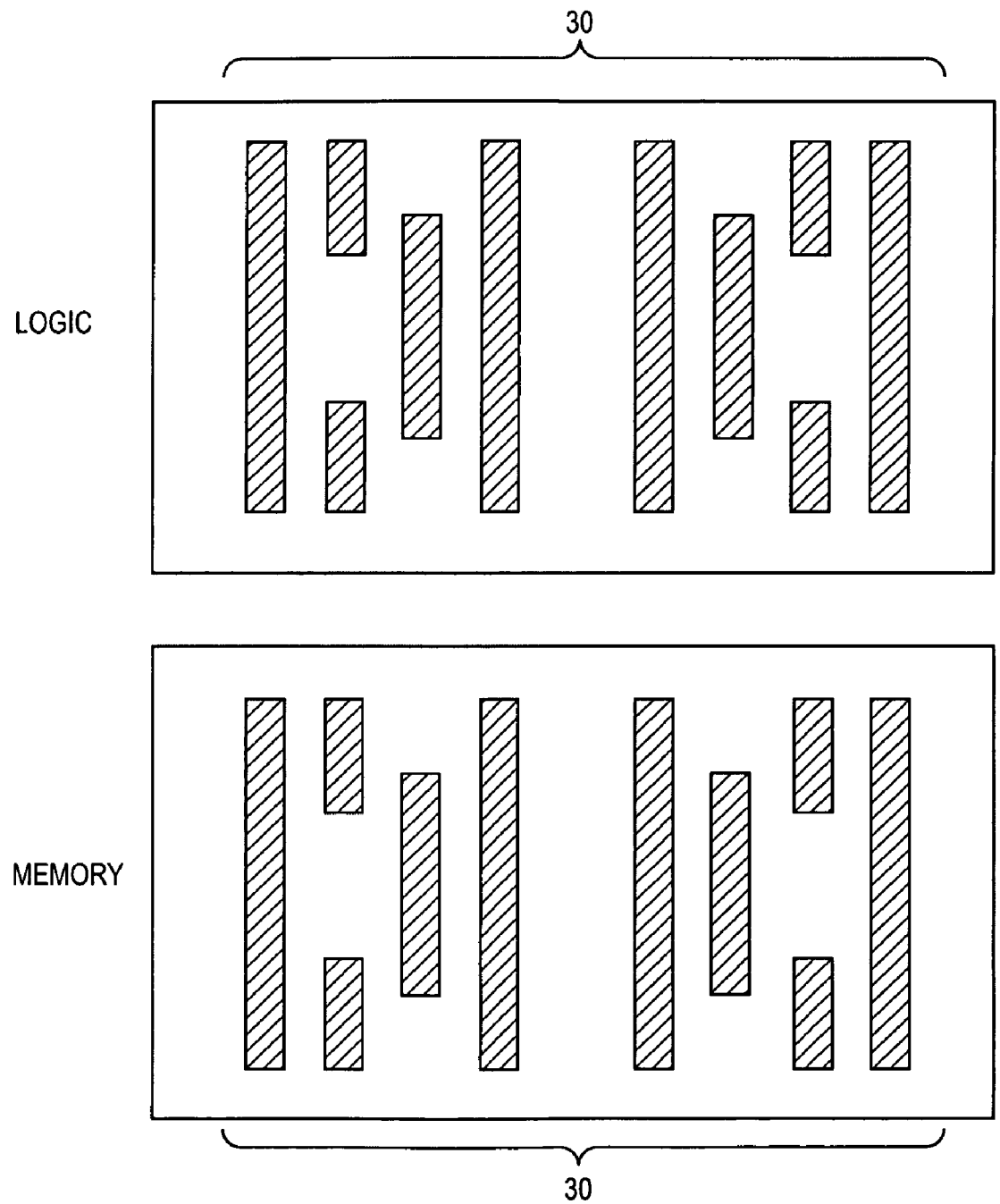
FIG. 4 illustrates the common grating pattern of FIG. 3 after trimming using a common trim pattern for both memory and logic according to one embodiment of this disclosure.
Figure 5:
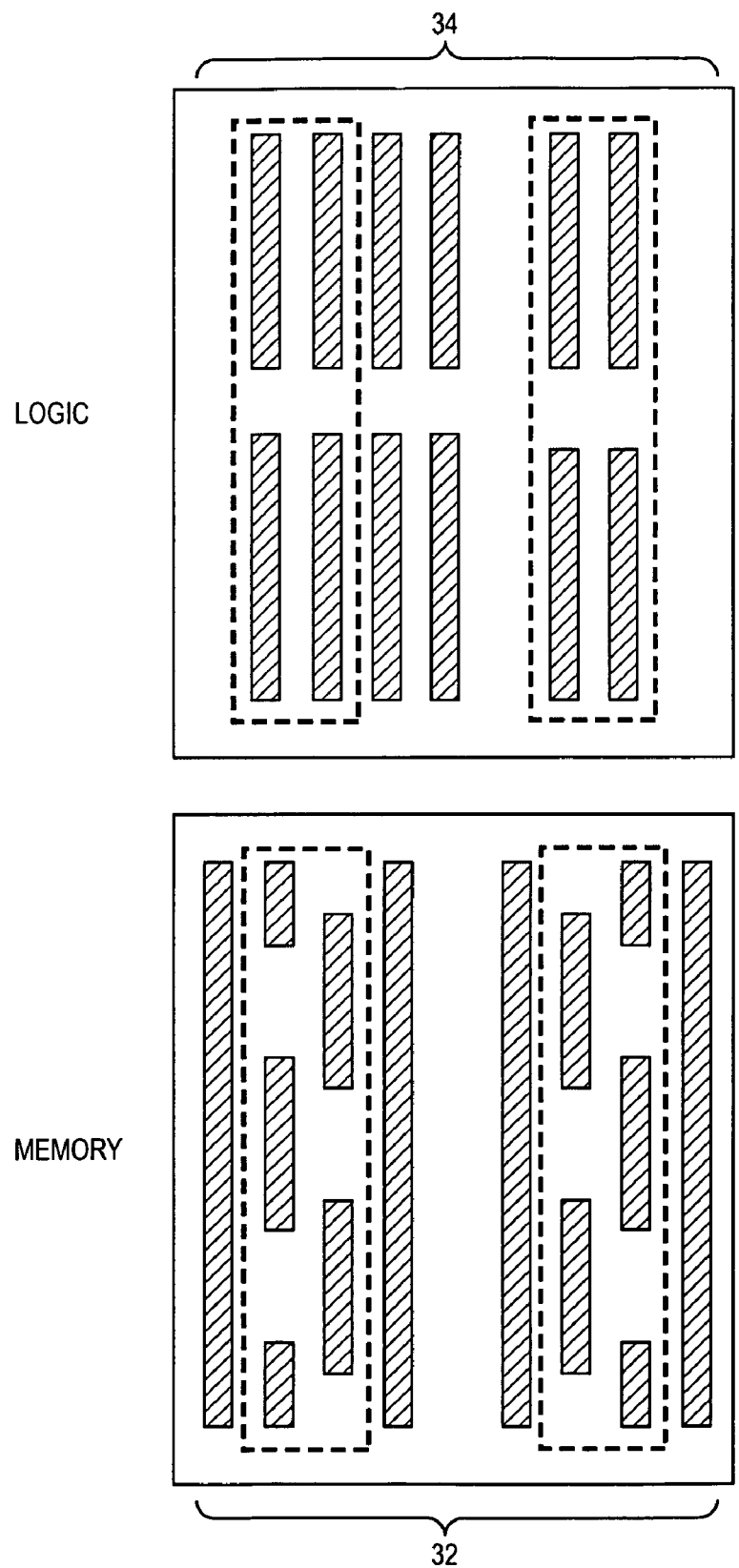
FIG. 5 illustrates the common grating pattern of FIG. 3 after trimming using different trim patterns for memory and logic according to one embodiment of this disclosure.

FIG. 3 illustrates a common grating pattern 26 for both memory and logic according to one embodiment of this disclosure. As illustrated, the common grating pattern 26 includes a regular pattern of gratings 28 of width (W) separated by pitch (P). The common grating pattern 26 may be defined by a mask, such as that used for photolithography, or defined by a direct write, or maskless, lithography technology such as electron beam lithography. In one embodiment, the common grating pattern 26 for both memory and logic is trimmed using a common trim pattern for both memory and logic resulting in a common trimmed grating pattern 30 for both memory and logic as illustrated in FIG. 4. The common trim pattern may be defined by a mask, such as that used for photolithography, or defined by a direct write, or maskless, lithography technology such as electron beam lithography. In another embodiment, the common grating pattern 26 for both memory and logic is trimmed using different trim patterns for memory and logic resulting in different trimmed grating patterns 32 and 34 for memory and logic, respectively, as illustrated in FIG. 5. The different trim patterns may be defined by masks, such as those used for photolithography, or defined by a direct write, or maskless, lithography technology such as electron beam lithography. Note that the trim pattern(s) may be less precise than the common grating pattern 26 because the trim pattern(s) define non-critical dimensions of the trimmed grating patterns 30, 32, and 34. This relaxes resolution and overlay requirements, thereby lowering the cost of the trim pattern(s) and lithography equipment.

Figure 6:
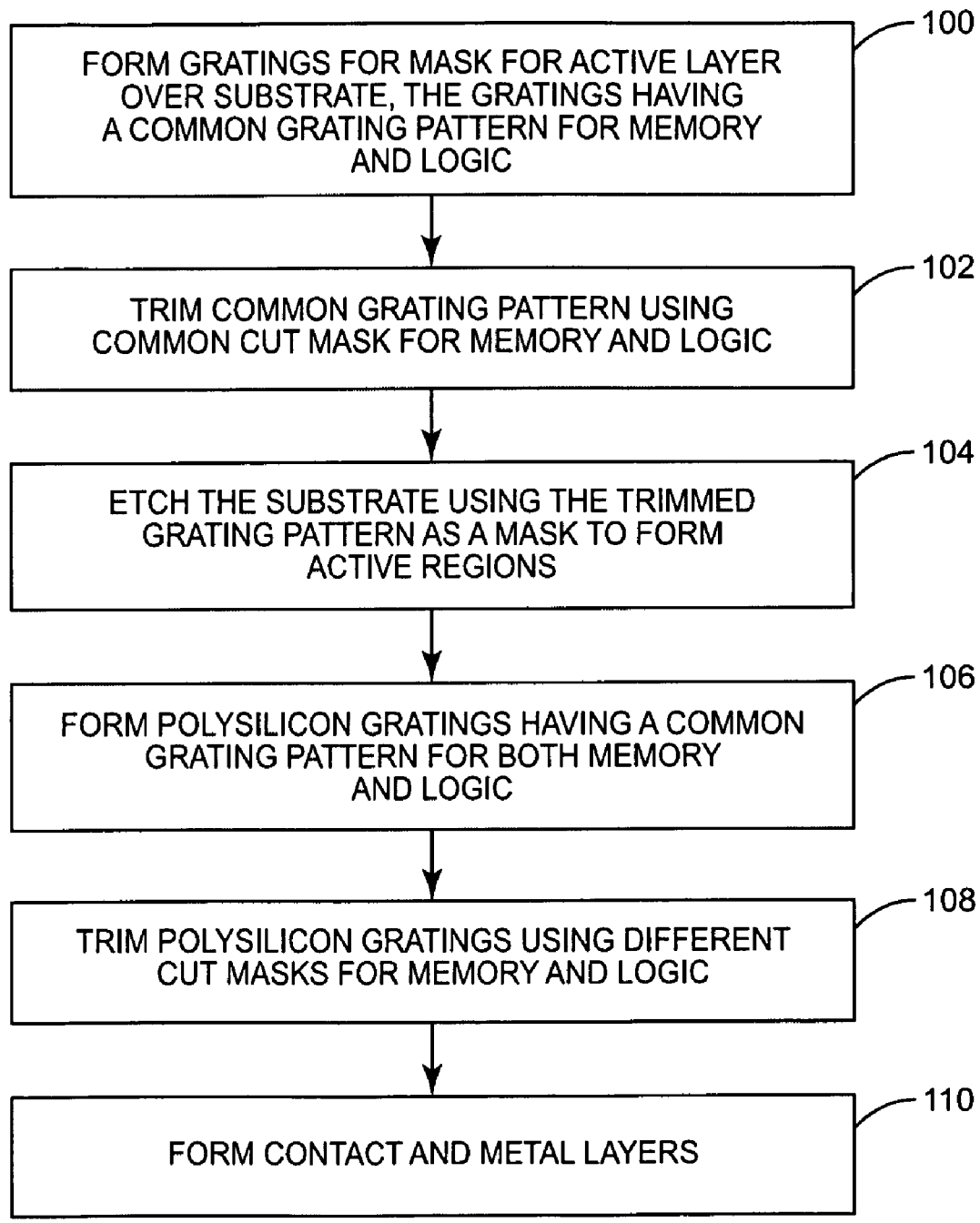
FIG. 6 is a flow chart for a process of fabricating an integrated circuit using a common grating pattern for memory and logic according to a first embodiment of this disclosure.

FIG. 6 is a flow chart for a process of fabricating the integrated circuit 10 using a common grating pattern and common trim pattern for the active layer 18 and a common grating pattern for the polysilicon layer 20 according to one embodiment of this disclosure. The resulting embodiment of the integrated circuit 10 may be described herein as having a common or shared Front End Of Line (FEOL). First, gratings for a mask for the active layer 18 are formed over the substrate 16, where the gratings for the mask for the active layer 18 have a common grating pattern for memory and logic (step 100). In one embodiment, the common grating pattern for the mask for the active layer 18 is optimized for memory. This may be particularly beneficial where a majority (e.g., greater than 50%) of the die area of the integrated circuit 10 is consumed by memory. As discussed below, the mask resulting from the gratings is used to form the active layer 18 and, more specifically, a number of active regions within the active layer 18.

Next, the common grating pattern for the mask for the active layer 18 is trimmed using a common trim pattern for both memory and logic (step 102). As stated above, the common trim pattern may be less precise than the gratings for the common grating pattern because the common trim pattern does not define a critical dimension for transistors forming the memory and logic devices. Note that as used herein, trimming generally refers to a patterning step for cutting or trimming a grating pattern in a double patterning process. As used herein, a double patterning process refers to all types of double patterning, double imaging, and double exposure processes. However, trimming may also refer to a patterning step for cutting or trimming a grating pattern in a patterning process have more than two patterning, imaging, or exposure steps. The substrate 16 is then etched or otherwise processed using the trimmed common grating pattern as the mask to form the active layer 18 and, more specifically, the active regions for the transistors forming the memory and logic devices (step 104).

Polysilicon gratings having a common grating pattern for both memory and logic are then formed over the active layer 18 (step 106). Note that this embodiment assumes that the integrated circuit 10 is implemented as a planar device. However, the present invention is not limited thereto. For instance, if the integrated circuit 10 is implemented as a device having vertical gates that surround, or partially surround, the active regions, the polysilicon gratings may be formed at least partially around the active regions in the active layer 18. Thus, in general, the polysilicon gratings having the common grating pattern for both memory and logic are said to be formed in relation to the active regions in the active layer 18. In one embodiment, the polysilicon gratings are optimized for memory. Again, this may be particularly beneficial where a majority (e.g., greater than 50%) of the die area of the integrated circuit 10 is consumed by memory.

The polysilicon gratings are then trimmed using different trim patterns for memory and logic (step 108). Locations at which the trimmed polysilicon gratings cross-over, or otherwise intersect, the active regions of the active layer 18 define gates of the transistors forming the memory and logic devices. As such, the trim patterns used for memory and logic depend on the topology of the memory and logic devices, respectively.

The common grating pattern for the mask for the active layer 18 and the common grating pattern of the polysilicon layer 20 define a fabric, which is generally a grid. The widths and pitches of the gratings in the common grating patterns for the active and polysilicon layers 18 and 20 vary depending on the particular implementation. As discussed above, in one embodiment, the widths and pitches of the gratings in the common grating patterns for the active and polysilicon layers 18 and 20 are optimized for memory (e.g., provide maximum memory density and reduced leakage power consumption). More specifically, in order to optimize the common grating patterns for memory, the width and pitch of the gratings in the common grating pattern for the mask for the active layer 18 may vary depending on parameters such as a cell topology of the memory devices (e.g., 5T SRAM, 6T SRAM, 7-transistor (7T) SRAM, 8T SRAM, etc.), a desired sizing of the active regions for the transistors forming the memory devices, a number of fingers desired for each of the transistors forming the memory devices, and the like. The number of fingers may be a particularly important parameter because all diffusion widths in the active layer 18 are identical as a result of the use of gratings, so device fingering may be used to increase transistor widths as desired. Other parameters such as, for example, desired contact pitch, desired active pitch, and desired active-to-well spacing may also affect the width and pitch of the gratings in the common grating patterns for the active and polysilicon layers 18 and 20.

Note that, at this point, in one embodiment, N+/P+ diffusions are formed in the active regions of the active layer 18 using the trimmed polysilicon gratings as a mask. The N+/P+ diffusions form sources and drains of the transistors forming the memory and logic devices, whereas the trimmed polysilicon gratings define gates of the transistors forming the memory devices. Lastly, contacts are formed to and/or from the memory and logic devices in the contact layer 22, and on-chip interconnects are formed in the one or more metal layers 24-1 through 24-N (step 110). Note that one or more of the contact layer 22 and the metal layers 24-1 through 24-N may be formed using common gratings for both memory and logic.

Figure 7A:
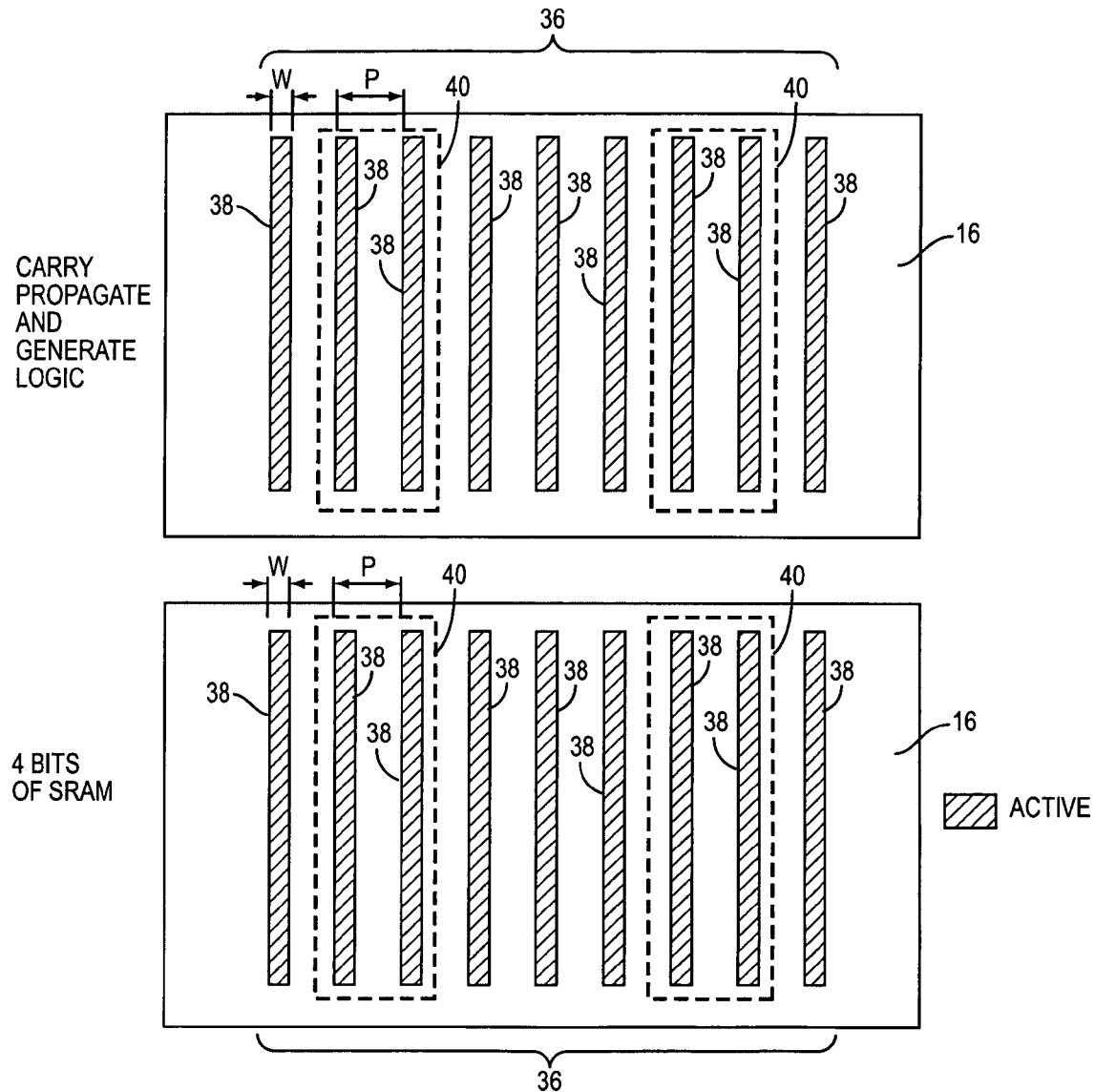
FIGS. 7A through 7G graphically illustrate the process of FIG. 6 for exemplary memory and logic.

FIGS. 7A through 7G graphically illustrate the process of FIG. 6 for exemplary memory and logic according to one embodiment of this disclosure. In this example, the memory devices are 6T SRAM cells and the logic devices are carry propagate and generate logic cells. As illustrated in FIG. 7A, a common grating pattern 36 for the mask for the active layer 18 is formed over the substrate 16. After trimming, the common grating pattern 36 defines locations for active regions for transistors forming the memory and logic devices. The common grating pattern 36 is the same for both memory and logic. More specifically, the common grating pattern 36 includes regularly spaced gratings 38 of the same width (W) and pitch (P) for both memory and logic. Note that while the gratings 38 illustrated in FIG. 7A are shown as being separated for memory and logic, the gratings 38 may at least initially be continuous, unbroken gratings 38 for both memory and logic. In this example, the substrate 16 is a p-type substrate including n-wells 40. As such, the gratings 38 over the n-wells 40 are used to define locations of active regions for p-type transistors, and the other gratings 38 over the p-type substrate 16 are used to define locations of active regions for n-types transistors.

Figure 7B:
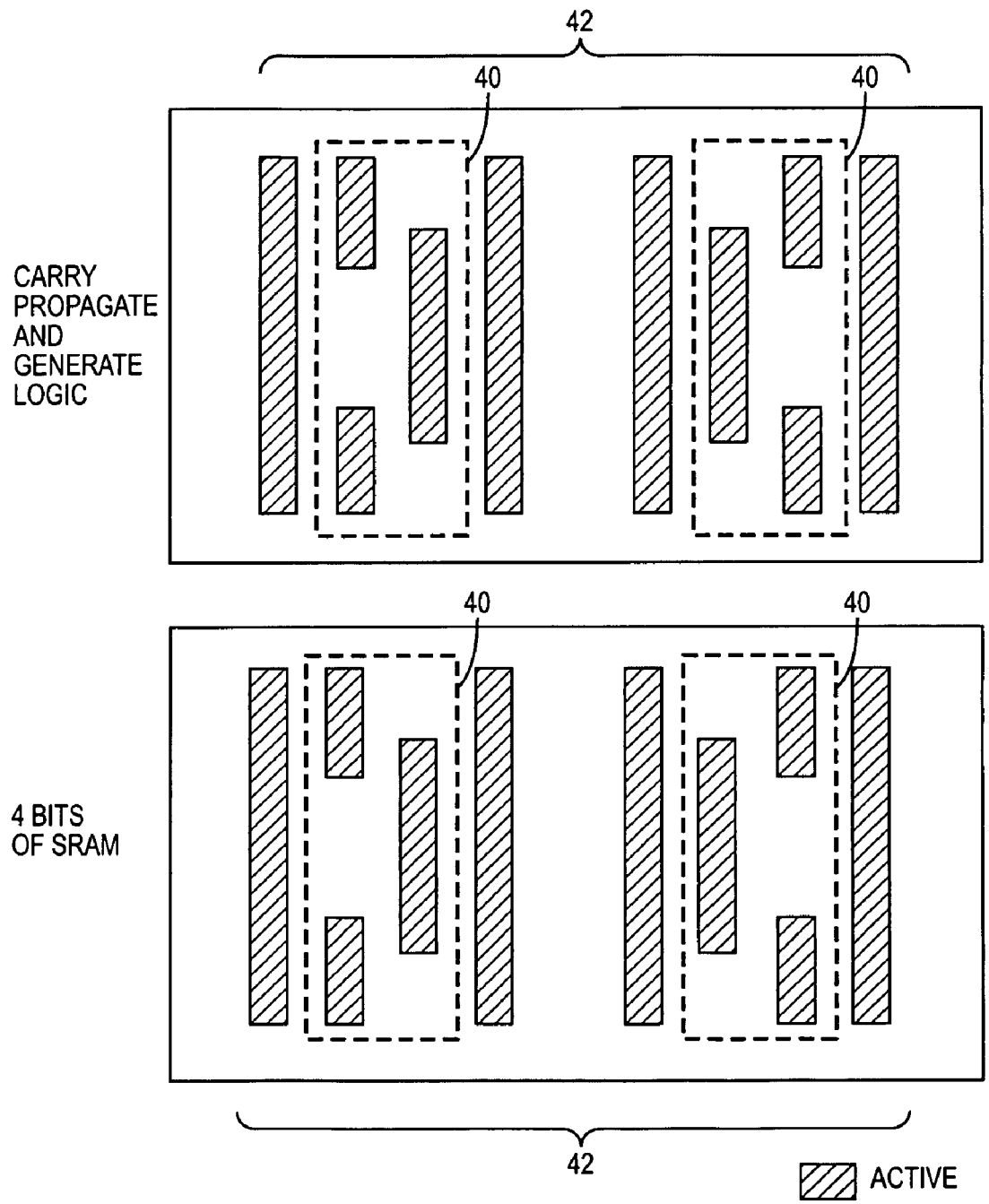

Next, a common trim pattern for both memory and logic is used to trim the common grating pattern 36 (FIG. 7A) to provide a common trimmed grating pattern 42 for both memory and logic as illustrated in FIG. 7B. The substrate 16 is then etched or otherwise processed using the common trimmed grating pattern 42 as a mask to form the active layer 18 and, more specifically, active regions within the active layer 18 according to the common trimmed grating pattern 42.

Figure 7C:
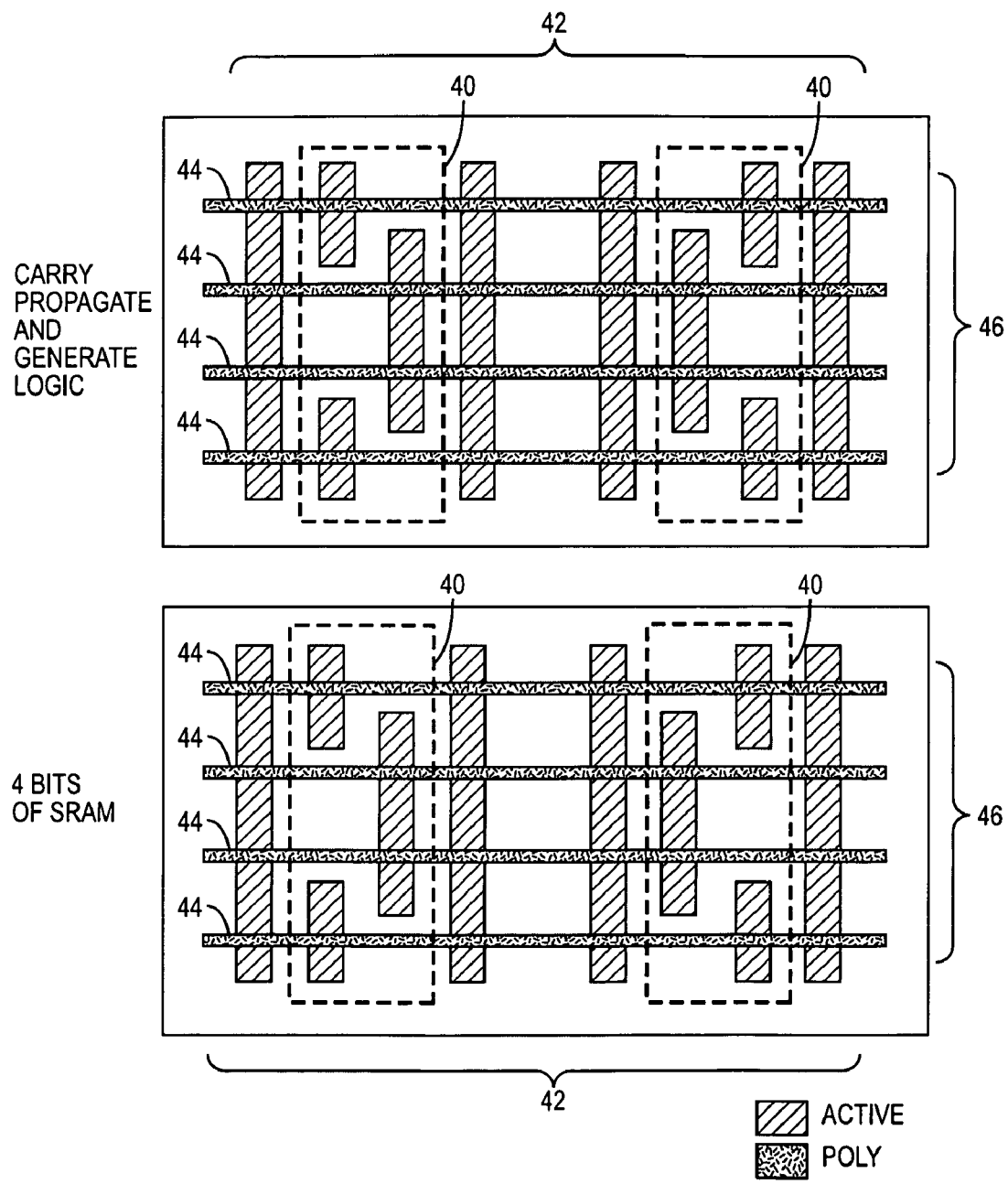
Figure 7D:
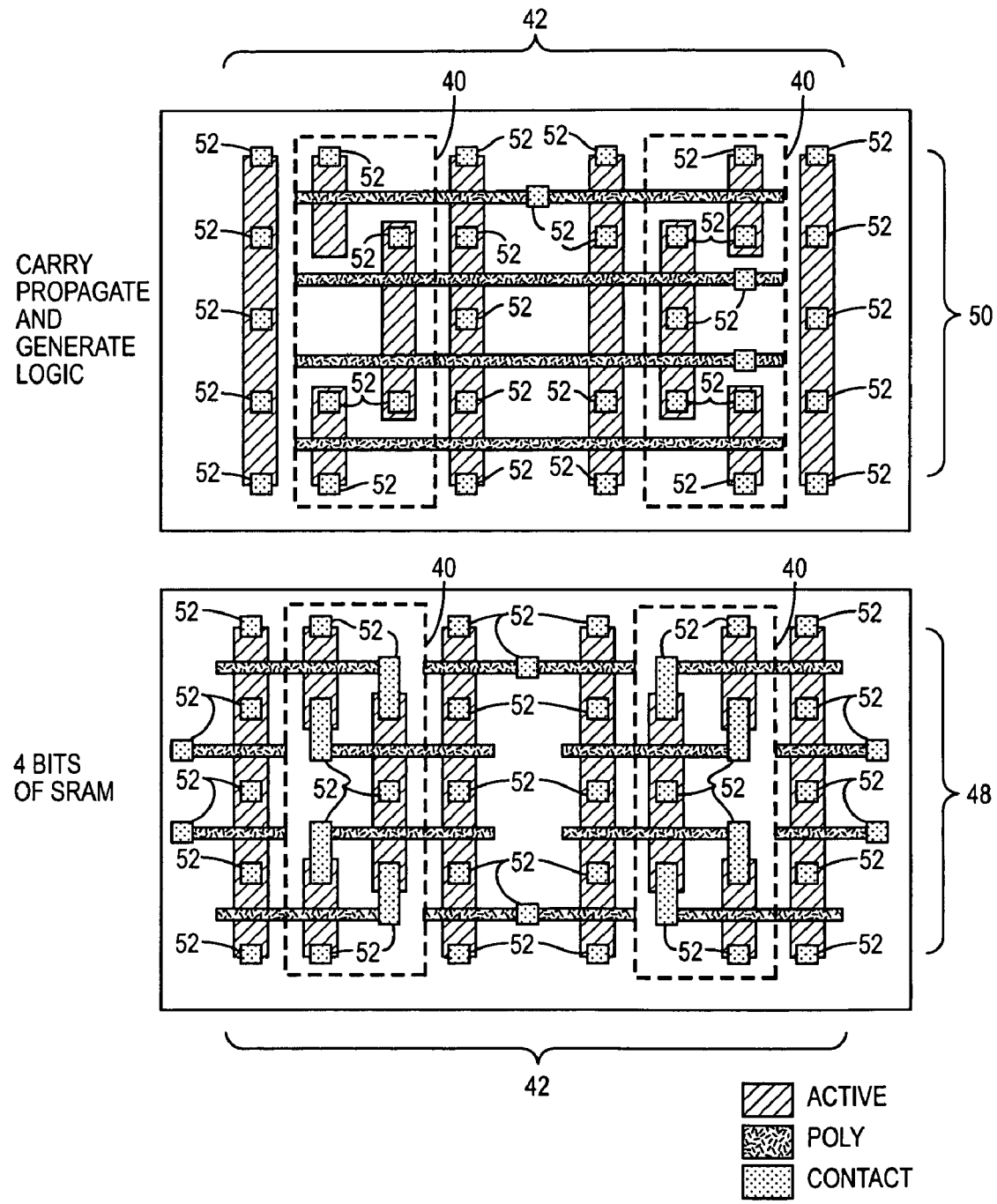

As illustrated in FIG. 7C, in this embodiment, polysilicon gratings 44 are formed over the active layer 18 such that the polysilicon gratings 44 form a common polysilicon grating pattern 46 for both memory and logic. As illustrated in FIG. 7D, different trim patterns are then used to trim the common polysilicon grating pattern 46 for memory and logic to provide different trimmed polysilicon grating patterns 48 and 50 for memory and logic, respectively. In addition, contacts 52 are formed at desired locations.

Figure 7E:
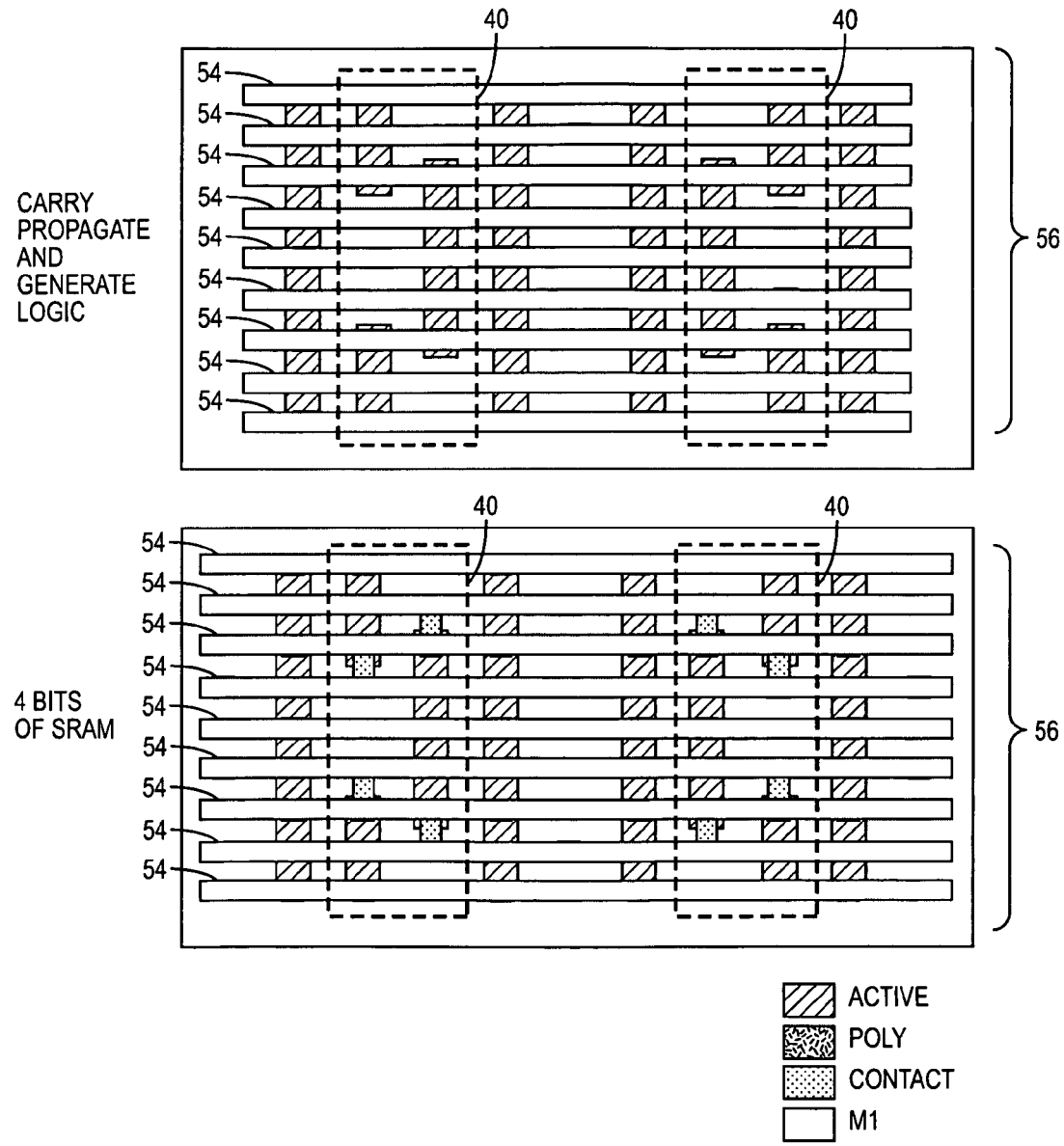
Figure 7F:
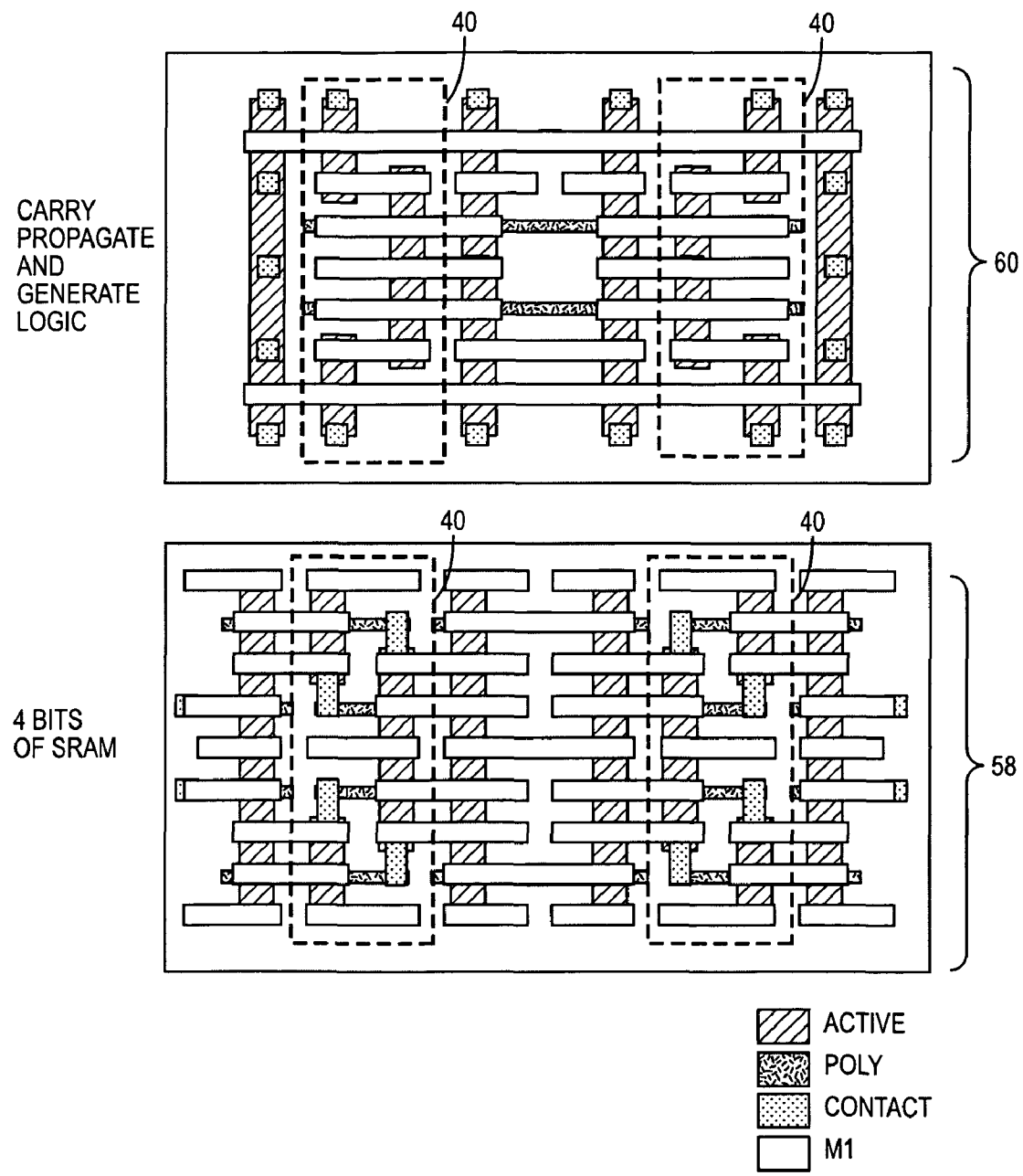
Figure 7G:
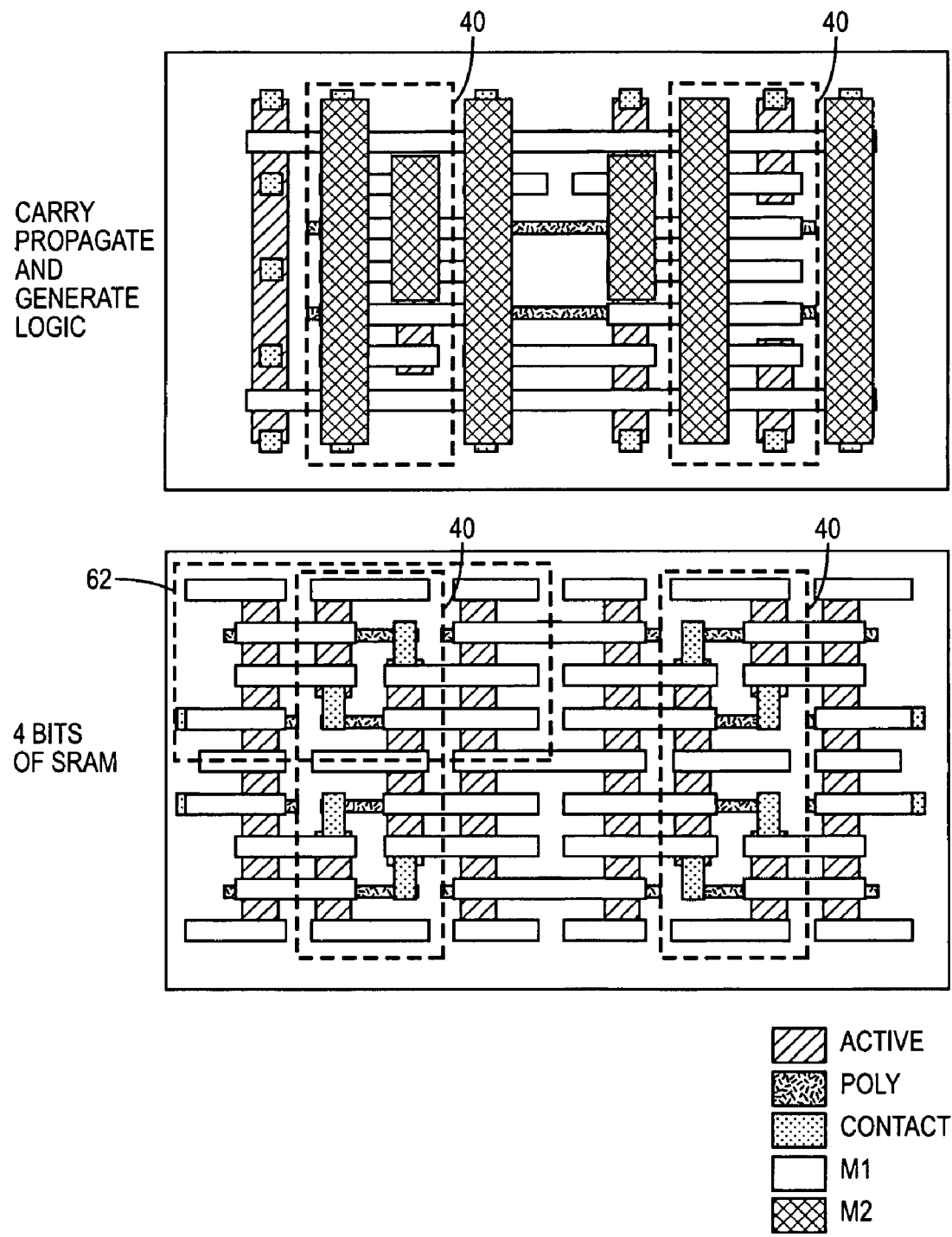

Next, metal gratings 54 are formed in a common metal grating pattern 56 for both memory and logic as illustrated in FIG. 7E. The common metal grating pattern 56 for both memory and logic is then trimmed using different trim patterns for memory and logic to provide different trimmed metal grating patterns 58 and 60 for memory and logic as illustrated in FIG. 7F. The trimmed metal grating patterns 58 and 60 form the metal layer 24-1. Next, in this example, a second metal layer 24-2 is formed as illustrated in FIG. 7G. As this point, fabrication of the integrated circuit 10 including a number of SRAM cells, such as SRAM cell 62, and logic is complete.

Note that for the shared FEOL embodiments, in order to map logic to the common trimmed grating pattern for the active layer 18, there may be restrictions on the type of logic and/or the logic style in which the logic is implemented. Logic styles that may be used include, but are not limited to, Complementary Metal Oxide Semiconductor (CMOS) logic, pass transistor logic, domino logic, Differential Cascode Voltage Switch Logic (DCVSL), and Differential Cascode Voltage Switch Pass-Gate Logic (DCVS-PG).

Figure 8:
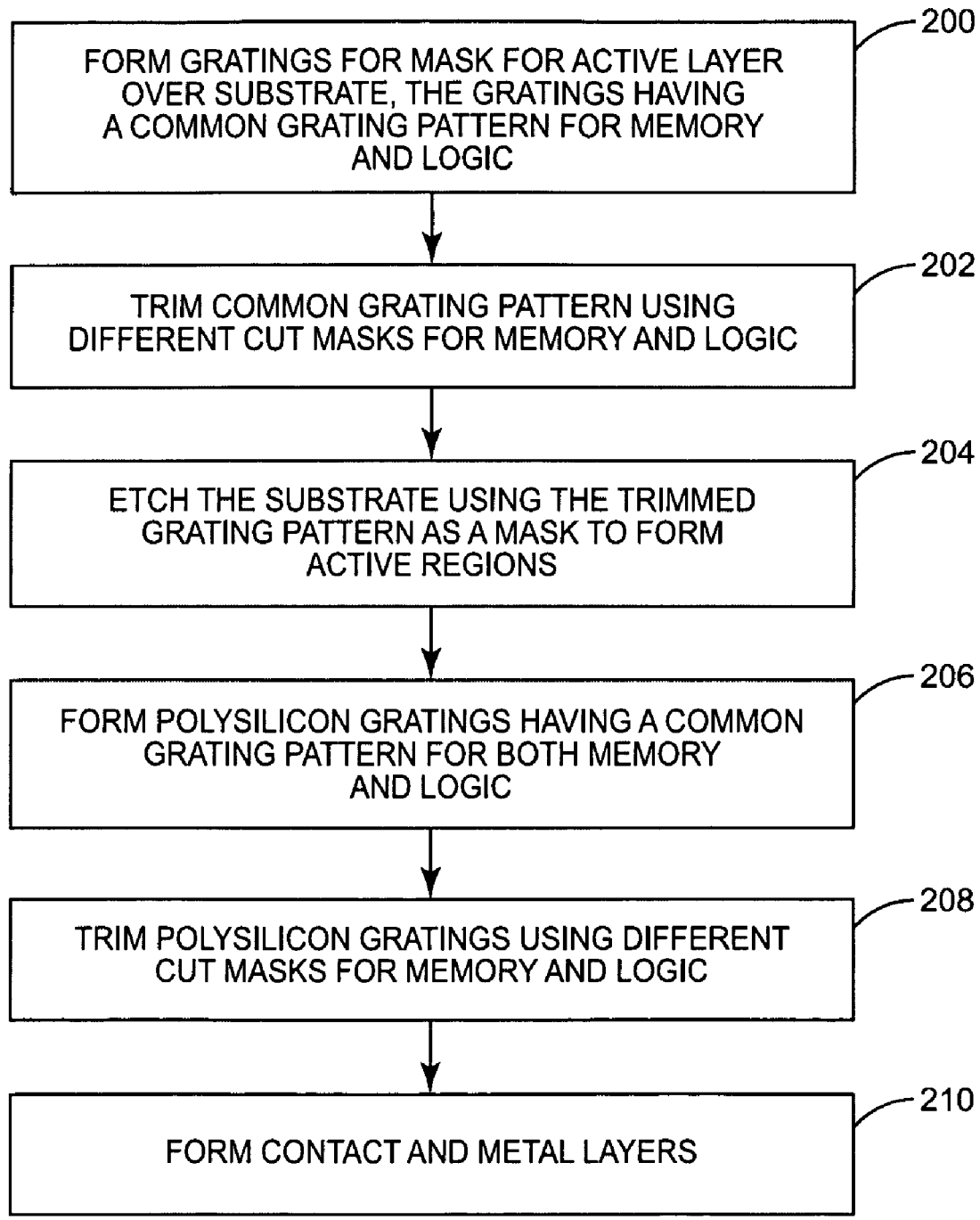
FIG. 8 is a flow chart for a process of fabricating an integrated circuit using a common grating pattern for memory and logic according to a second embodiment of this disclosure.

FIG. 8 is a flow chart for a process of fabricating the integrated circuit 10 using common grating patterns for both memory and logic for the active and polysilicon layers 18 and 20 according to another embodiment of this disclosure. The resulting embodiment of the integrated circuit 10 may be described herein as having common or shared gratings. First, gratings for a mask for the active layer 18 are formed over the substrate 16, where the gratings for the mask for the active layer 18 have a common grating pattern for memory and logic (step 200). In one embodiment, the grating pattern for the mask for the active layer 18 is optimized for memory. This may be particularly beneficial where a majority (e.g., greater than 50%) of the die area of the integrated circuit 10 is consumed by memory. As discussed below, the mask resulting from the gratings is used to form the active layer 18 and, more specifically, a number of active regions within the active layer 18.

Next, the common grating pattern for the mask for the active layer 18 is trimmed using different trim patterns for memory and logic (step 202). As stated above, the trim patterns may be less precise than the gratings for the common grating pattern because the trim patterns do not define critical dimensions for transistors forming the memory and logic devices. The substrate 16 is then etched or otherwise processed using the trimmed common grating pattern as the mask to form the active layer 18 and, more specifically, the active regions for the transistors forming the memory and logic devices (step 204).

Polysilicon gratings having a common grating pattern for both memory and logic are then formed over the active layer 18 or otherwise formed in relation to the active layer 18 (step 206). In one embodiment, the polysilicon gratings are optimized for memory. Again, this may be particularly beneficial where a majority (e.g., greater than 50%) of the die area of the integrated circuit 10 is consumed by memory. The polysilicon gratings are then trimmed using different trim patterns for memory and logic (step 208). Locations at which the trimmed polysilicon gratings cross-over, or otherwise intersect, the active regions of the active layer 18 define gates of the transistors forming the memory and logic devices. As such, the trim patterns used for the memory and logic depend on the topology of the memory and logic devices, respectively.

The common grating pattern for the mask for the active layer 18 and the common grating pattern of the polysilicon layer 20 define a fabric, which is generally a grid. The widths and pitches of the gratings in the common grating patterns for the active and polysilicon layers 18 and 20 vary depending on the particular implementation. As discussed above, in one embodiment, the widths and pitches of the gratings in the common grating patterns for the active and polysilicon layers 18 and 20 are optimized for memory (e.g., provide maximum memory density and reduced leakage power consumption). More specifically, in order to optimize the common grating patterns for memory, the width and pitch of the gratings in the common grating pattern for the mask for the active layer 18 may vary depending on parameters such as a cell topology of the memory devices (e.g., 5T SRAM, 6T SRAM, 7T SRAM, 8T SRAM, etc.), a desired sizing of the active regions for the transistors forming the memory devices, a number of fingers desired for each of the transistors forming the memory devices, and the like. The number of fingers may be a particularly important parameter because all diffusion widths in the active layer are identical as a result of the use of gratings, so device fingering may be used to increase transistor widths as desired. Other parameters such as, for example, desired contact pitch, desired active pitch, and desired active-to-well spacing may also affect the width and pitch of the gratings in the common grating patterns for the active and polysilicon layers 18 and 20.

Note that, at this point, in one embodiment, N+/P+ diffusions are formed in the active regions of the active layer 18 using the trimmed polysilicon gratings as a mask. The N+/P+ diffusions form sources and drains of the transistors forming the memory and logic devices, whereas the trimmed polysilicon gratings define gates of the transistors forming the memory devices. Lastly, contacts are formed to and/or from the memory and logic devices in the contact layer 22, and on-chip interconnects are formed in the one or more metal layers 24-1 through 24-N (step 210). Note that one or more of the contact layer 22 and the metal layers 24-1 through 24-N may be formed using common gratings for both memory and logic.

Figure 9A:
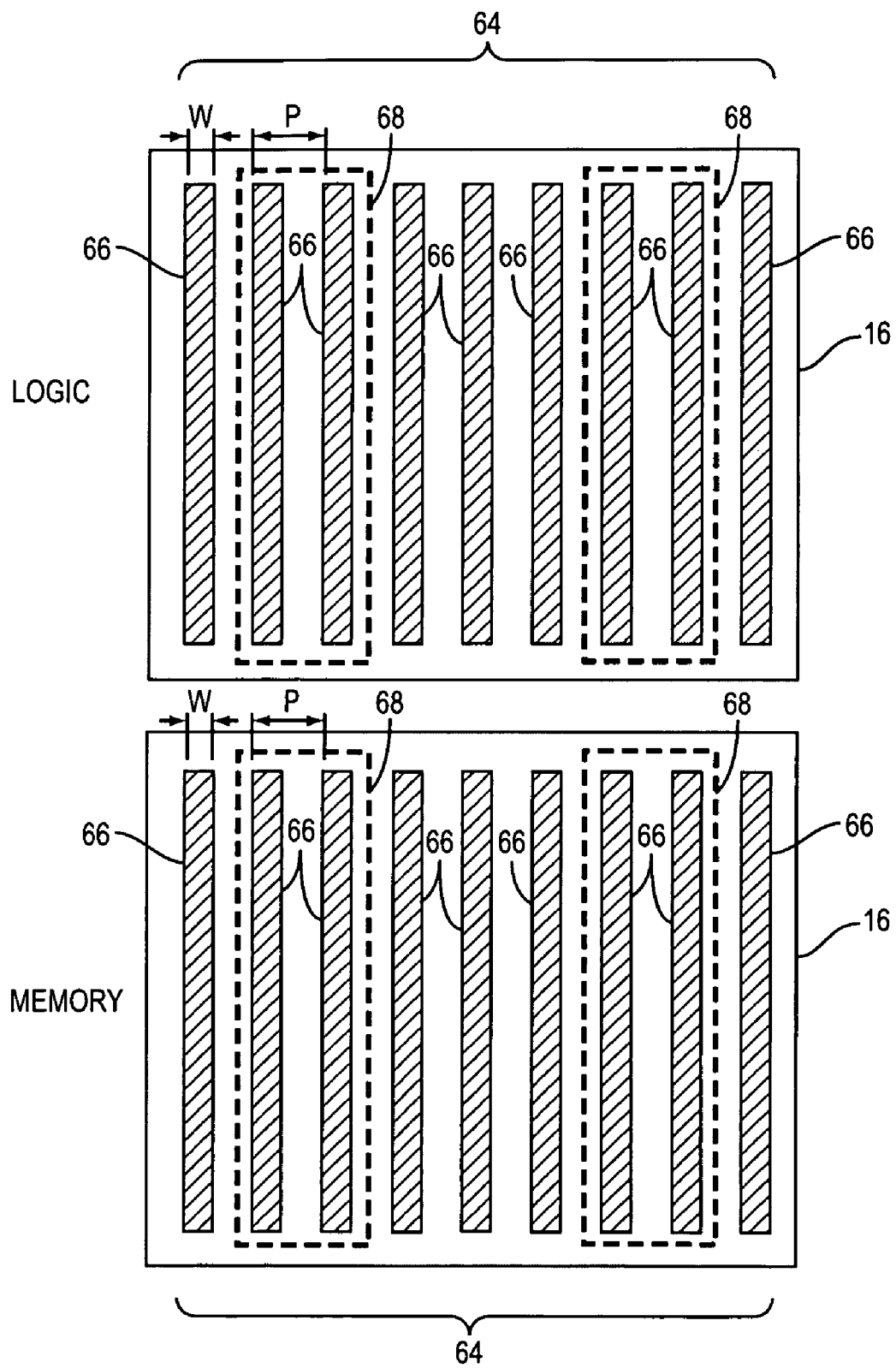
FIGS. 9A through 9C graphically illustrate the process of FIG. 8 for exemplary memory and logic.
Figure 9B:
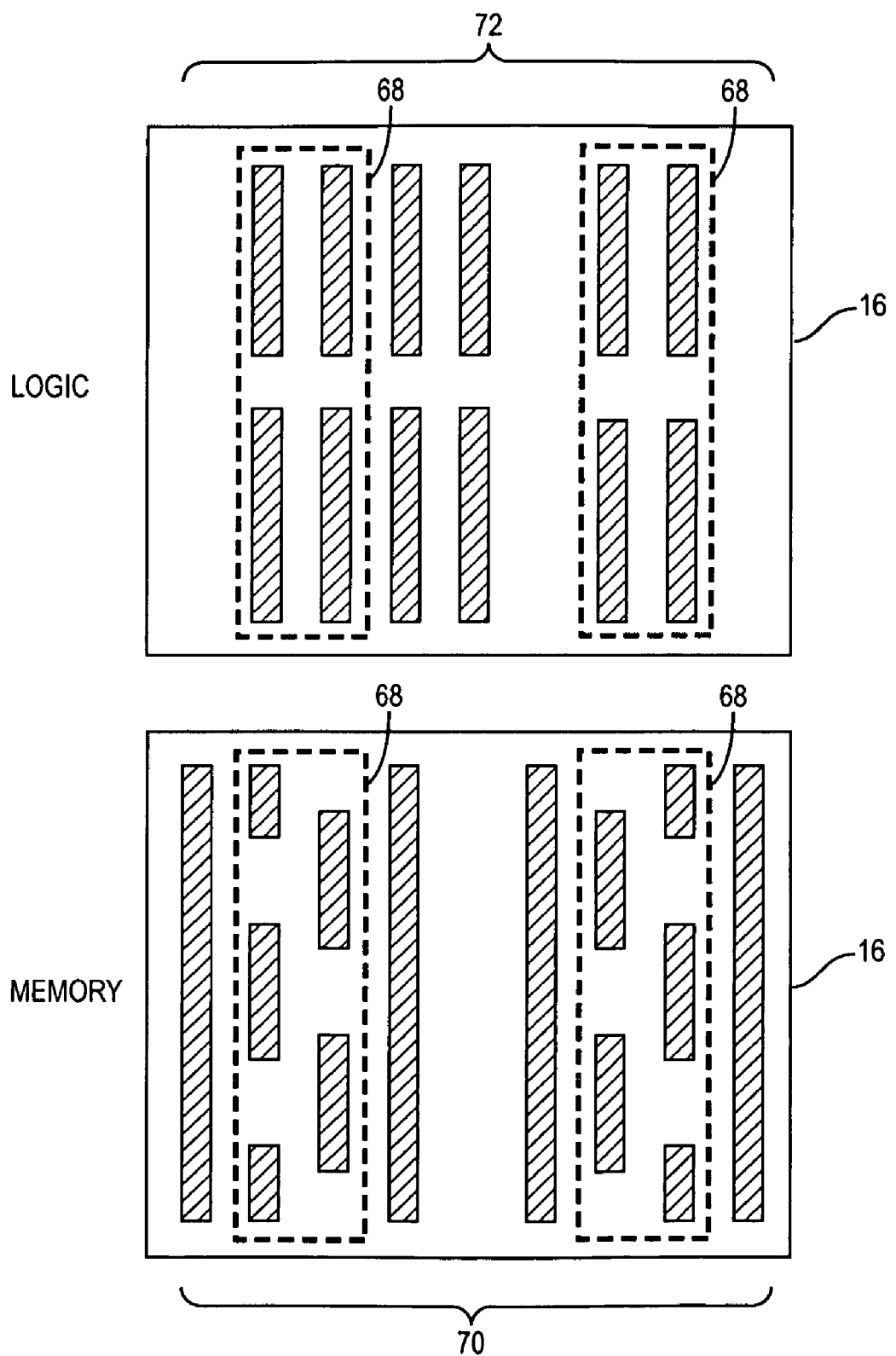
Figure 9C:
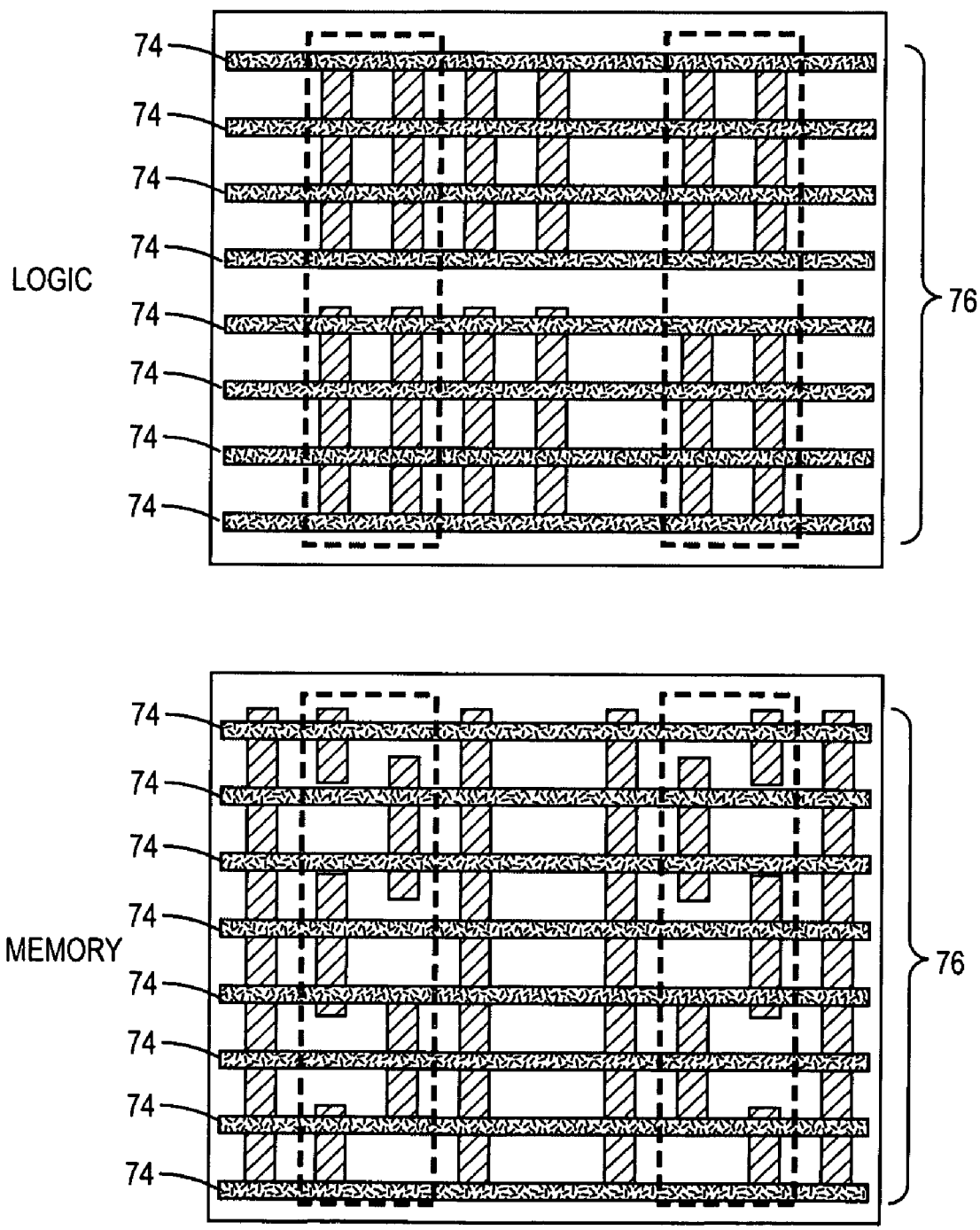

FIGS. 9A through 9C graphically illustrate the process of FIG. 8 for exemplary memory and logic according to one embodiment of this disclosure. In this example, the memory devices are 6T SRAM cells. As illustrated in FIG. 9A, a common grating pattern 64 for the mask for the active layer 18 is formed over the substrate 16. The common grating pattern 64 is the same for both memory and logic. More specifically, the common grating pattern 64 includes regularly spaced gratings 66 of the same width (W) and pitch (P). In this example, the substrate 16 is a p-type substrate including n-wells 68. As such, the gratings 66 over the n-wells 68 are used to define locations of active regions for p-type transistors, and the other gratings 66 over the p-type substrate 16 are used to define locations of active regions for n-types transistors. Next, different trim patterns for memory and logic are used to trim the common grating pattern 64 (FIG. 9A) to provide a trimmed grating pattern 70 for memory and a different trimmed grating pattern 72 for logic as illustrated in FIG. 9B. The substrate 16 is then etched using the trimmed grating patterns 70 and 72 as a mask to form the active layer 18 and, more specifically, active regions within the active layer 18 according to the trimmed grating patterns 70 and 72.

As illustrated in FIG. 9C, polysilicon gratings 74 are formed over the active layer 18 such that the polysilicon gratings 74 form a common polysilicon grating pattern 76 for both memory and logic. From this point, the process proceeds as described above. In general, the polysilicon gratings 74 are trimmed using different trim patterns for memory and logic. Then, the contact layer 22 is formed over the polysilicon layer 20, and the one or more metal layers 24-1 through 24-N are formed over the contact layer 22.

Figure 10:
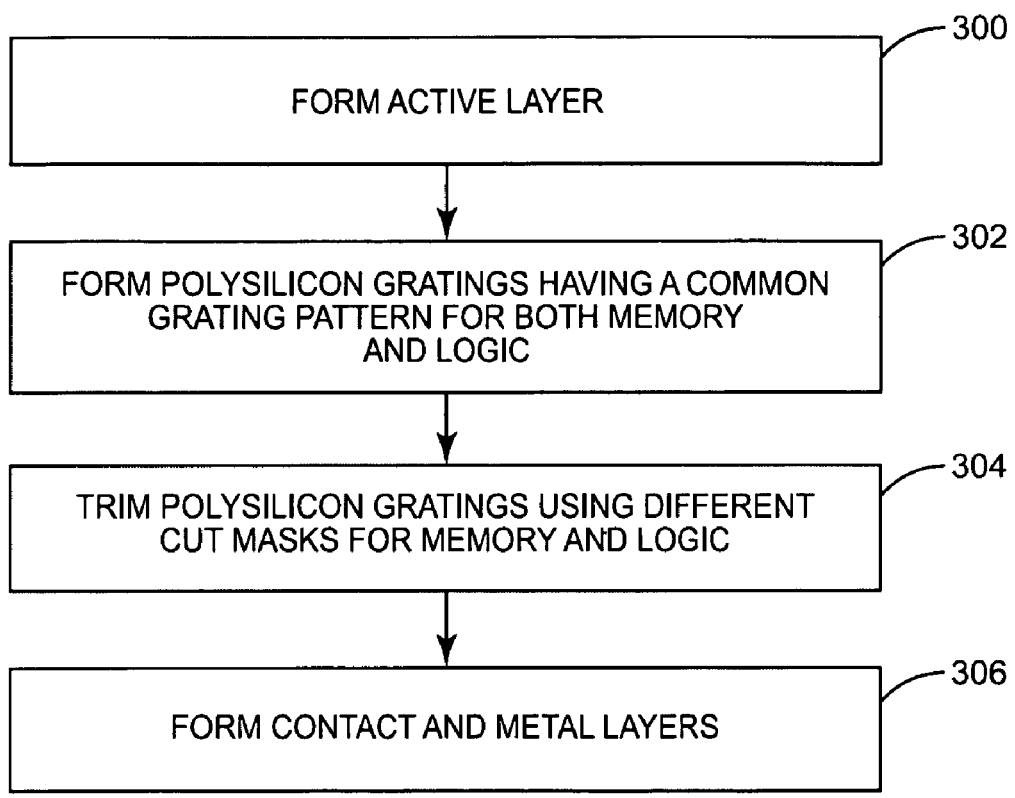
FIG. 10 is a flow chart for a process of fabricating an integrated circuit using a common grating pattern for memory and logic according to a third embodiment of this disclosure.

FIG. 10 is a flow chart for a process of fabricating the integrated circuit 10 using a common grating pattern for both memory and logic for the polysilicon layer 20 according to another embodiment of this disclosure. First, the active layer 18 is formed (step 300). In this embodiment, a grating pattern may not be used to define the active regions for memory, logic, or both memory and logic. Further, the active region pattern for memory and logic may or may not be the same. Next, polysilicon gratings having a common grating pattern for both memory and logic are formed over the active layer 18 or otherwise formed in relation to the active layer 18 (step 302). In one embodiment, the polysilicon gratings are optimized for memory. Again, this may be particularly beneficial where a majority (e.g., greater than 50%) of the die area of the integrated circuit 10 is consumed by memory. The polysilicon gratings are then trimmed using different trim patterns for memory and logic (step 304). Locations at which the trimmed polysilicon gratings cross-over, or otherwise intersect, the active regions of the active layer 18 define gates of the transistors forming the memory and logic devices. As such, the trim patterns used for memory and logic depend on the topology of the memory and logic devices, respectively.

The widths and pitches of the polysilicon gratings may vary depending on the particular implementation. As discussed above, in one embodiment, the widths and pitches of the polysilicon gratings are optimized for memory (e.g., provide maximum memory density and reduced leakage power consumption). More specifically, in order to optimize the polysilicon gratings for memory, the width and pitch of the polysilicon gratings in the common polysilicon grating pattern may vary depending on parameters such as a cell topology of the memory devices (e.g., 5T SRAM, 6T SRAM, 7T SRAM, 8T SRAM, etc.), a desired sizing of the active regions for the transistors forming the memory devices, a number of fingers desired for each of the transistors forming the memory devices, and the like. The number of fingers may be a particularly important parameter because all diffusion widths in the active layer 18 are identical as a result of the use of gratings, so device fingering may be used to increase transistor widths as desired. Other parameters such as, for example, desired contact pitch, desired active pitch, and desired active-to-well spacing may also affect the width and pitch of the polysilicon gratings in the common polysilicon grating pattern.

Note that, at this point, in one embodiment, N+/P+ diffusions are formed in the active regions of the active layer 18 using the trimmed polysilicon gratings as a mask. The N+/P+ diffusions form sources and drains of the transistors forming the memory and logic devices, whereas the trimmed polysilicon gratings define gates of the transistors forming the memory devices. Lastly, contacts are formed to and/or from the memory and logic devices in the contact layer 22, and on-chip interconnects are formed in the one or more metal layers 24-1 through 24-N (step 306). Note that one or more of the contact layer 22 and the metal layers 24-1 through 24-N may be formed using common gratings for both memory and logic.

Figure 11A:
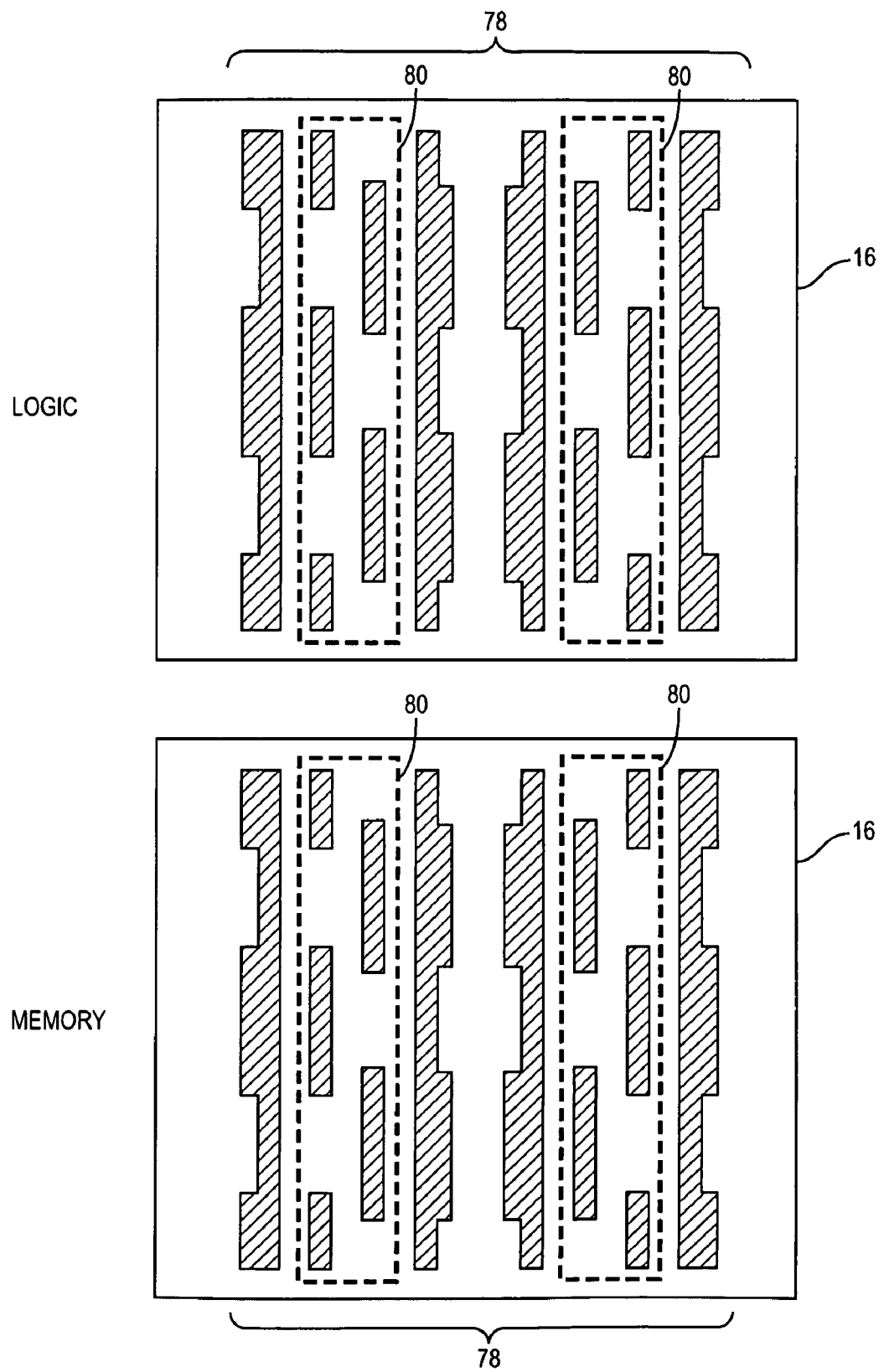
FIGS. 11A and 11B graphically illustrate the process of FIG. 10 for exemplary memory and logic having a common active layer pattern according to one embodiment of this disclosure.
Figure 11B:
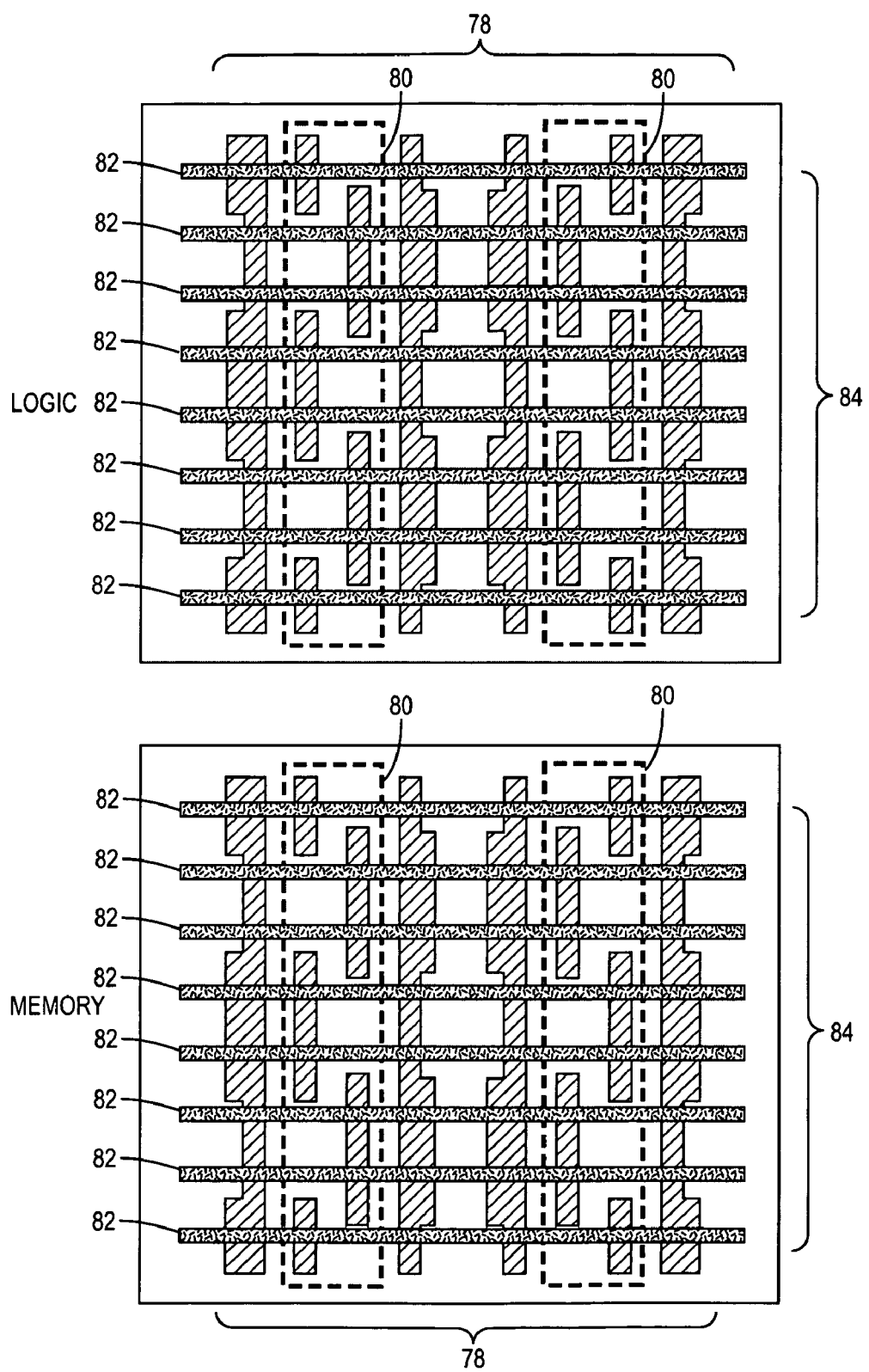

FIGS. 11A and 11B graphically illustrate the process of FIG. 10 for exemplary memory and logic according to one embodiment of this disclosure. In this example, the memory devices are 6T SRAM cells. As illustrated in FIG. 11A, a common pattern 78 for the mask for the active layer 18 is formed over the substrate 16. As discussed above with respect to FIG. 10, the pattern for the active layer 18 may or may not be the same for both memory and logic. However, in this exemplary embodiment, the common pattern 78 is the same for both memory and logic. However, in this embodiment, the common pattern 78 is not formed using a regular pattern of gratings having the same width and pitch. Rather, the common pattern 78 is a pattern that is desirable for 6T SRAM cells. In this example, the substrate 16 is a p-type substrate including n-wells 80. As such, p-type transistors are formed in the n-wells 80, and n-type transistors are formed in the p-type areas of the substrate 16. The substrate 16 is then etched using the common pattern 78 as a mask to form the active layer 18 and, more specifically, active regions within the active layer 18 according to the common pattern 78.

As illustrated in FIG. 11B, polysilicon gratings 82 are formed over the active layer 18 such that the polysilicon gratings 82 form a common polysilicon grating pattern 84 for both memory and logic. From this point, the process proceeds as described above. In general, the polysilicon gratings 82 are trimmed using different trim patterns for memory and logic. Then, the contact layer 22 is formed over the polysilicon layer 20, and the one or more metal layers 24-1 through 24-N are formed over the contact layer 22.

Figure 12A:
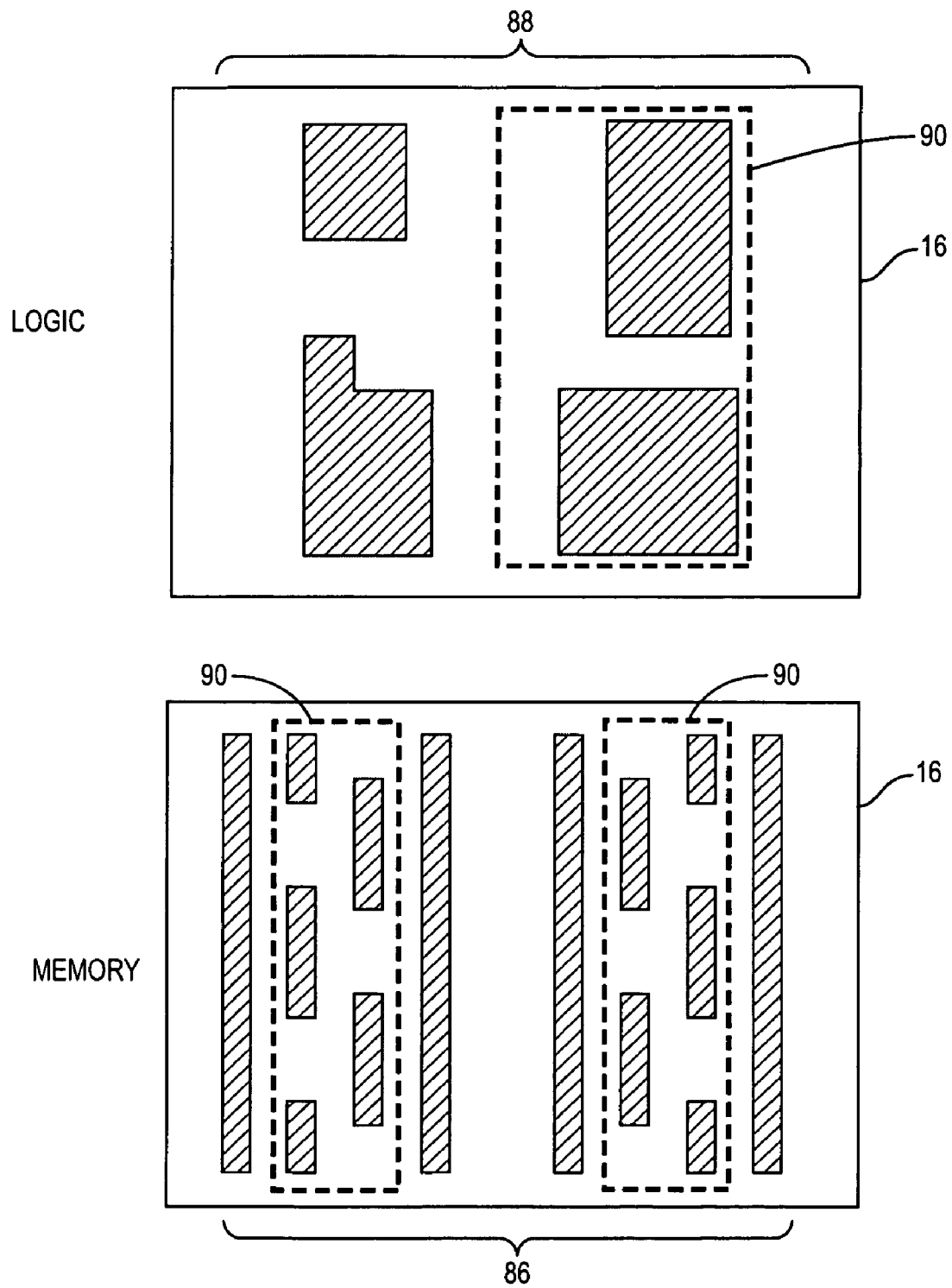
FIGS. 12A and 12B graphically illustrate the process of FIG. 10 for exemplary memory and logic having different active layer patterns according to another embodiment of this disclosure.
Figure 12B:
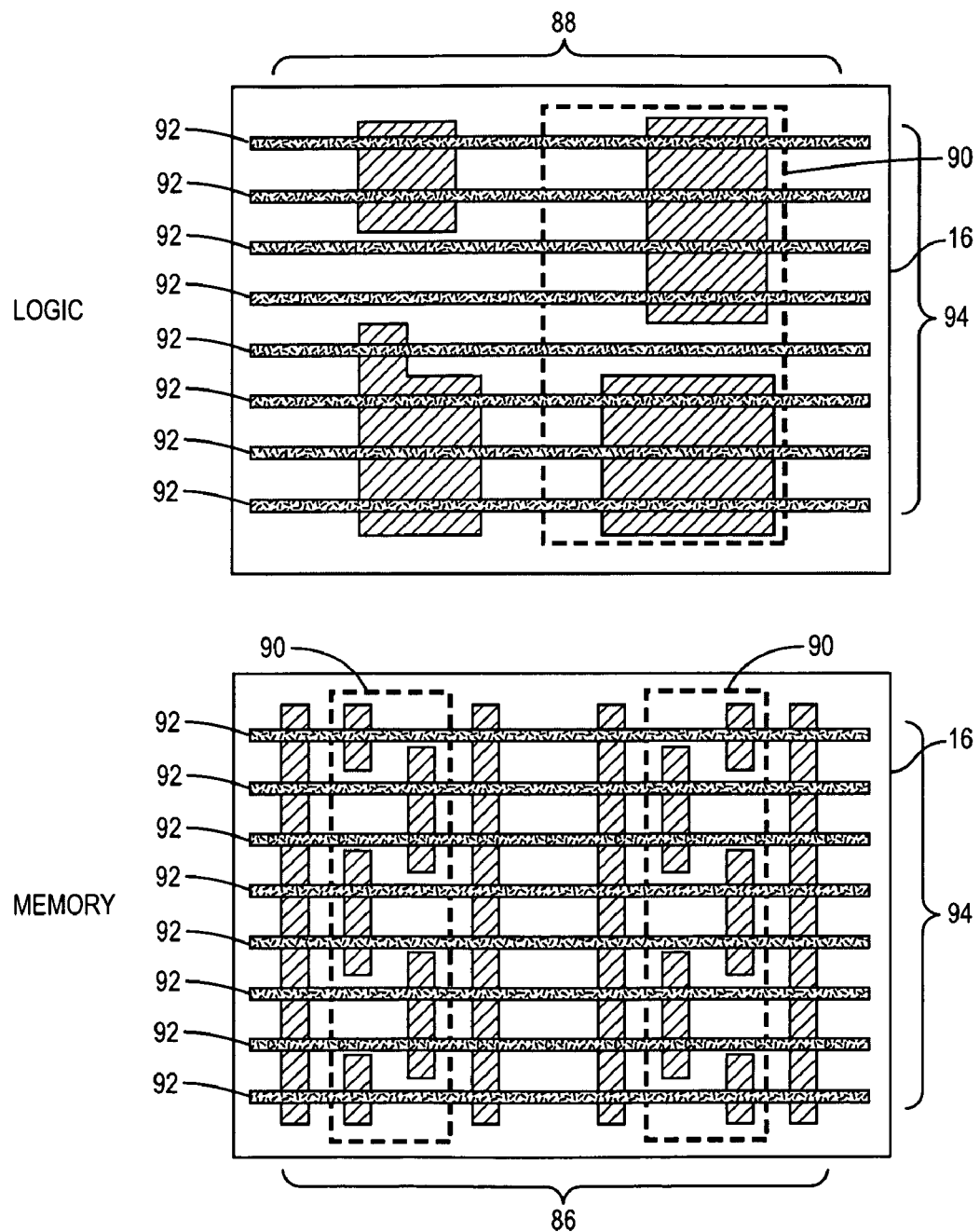

FIGS. 12A and 12B graphically illustrate the process of FIG. 10 for exemplary memory and logic according to another embodiment of this disclosure. In this example, the memory devices are 6T SRAM cells. As illustrated in FIG. 12A, different patterns 86 and 88 for the mask for the active layer 18 are formed over the substrate 16. In this embodiment, the pattern 86 for memory may be formed using gratings and is desirable for 6T SRAM cells. The pattern 88 for logic is a desired pattern for the particular logic being implemented. In this example, the substrate 16 is a p-type substrate including n-wells 90. As such, p-type transistors are formed in the n-wells 90, and n-type transistors are formed in the p-type areas of the substrate 16. The substrate 16 is then etched using the patterns 86 and 88 as a mask to form the active layer 18 and, more specifically, active regions within the active layer 18 according to the patterns 86 and 88.

As illustrated in FIG. 12B, polysilicon gratings 92 are formed over the active layer 18 such that the polysilicon gratings 92 form a common polysilicon grating pattern 94 for both memory and logic. From this point, the process proceeds as described above. In general, the polysilicon gratings 92 are trimmed using different trim patterns for memory and logic. Then, the contact layer 22 is formed over the polysilicon layer 20, and the one or more metal layers 24-1 through 24-N are formed over the contact layer 22.

FIGS. 13A and 13B illustrate a diffusion breaking dummy transistor according to an exemplary embodiment of this disclosure. A diffusion breaking dummy transistor may particularly be used in shared FEOL embodiments of the integrated circuit 10 having unbroken diffusions, or active regions, for a logic cell. Using the common trimmed grating pattern 30 (FIG. 4) for the active layer 18 for both memory and logic as an example, because the active regions, or diffusions, for n-type transistors are unbroken, every node in logic library implemented in the logic area of the integrated circuit 10 is ideally connected to an even number of n-type transistors in order to prevent shorts. When every node in the logic library is not connected to an even number of n-type transistors, diffusion breaking dummy transistors with their gates tied to ground are added.

FIG. 13A illustrates a CMOS NAND gate 96, which includes p-type transistors P1 and P2 and n-type transistors N1 and N2 arranged as shown. In addition, the CMOS NAND gate 96 includes a diffusion breaking dummy transistor N3 connected as shown. FIG. 13B illustrates the CMOS NAND gate 96 of FIG. 13A implemented using the common trimmed grating pattern 30 (FIG. 4) for the active layer 18 for both memory and logic. Because of the common trimmed grating pattern 30 for the active layer 18 for both memory and logic, an active area 98 used for the n-type transistors N1 and N2 of the CMOS NAND gate 96 is unbroken. The diffusion breaking dummy transistor N3 electrically breaks the active area 98.

Both the shared FEOL and the shared gratings embodiments of the integrated circuit 10 offer substantial benefits. A first benefit is a reduction or even elimination of grating mask costs and complexity. A second benefit is the potential for amortization of grating mask costs over several designs. A third benefit is that minimized feature density in the cut masks makes direct-write e-beam more affordable for low-volume to mid-volume parts. A fourth benefit is that yield is improved as a result of an improvement in process windows and reduced variability. Note that these benefits are exemplary and are not intended to limit the scope of the concepts disclosed herein.

The embodiments described herein can be applied to silicon-based fabrication techniques where patterning is utilized for traditional silicon CMOS. As will be understood by those skilled in the art, these same concepts can be straightforwardly extended to post-silicon technologies, such as, for example, carbon nanotube field-effect transistors (FETs) or other nanowire FETs, in which grating-like arrays of devices may serve as a starting point in the fabrication process.

Those skilled in the art will recognize improvements and modifications to the embodiments of the present invention. All such improvements and modifications are considered within the scope of the concepts disclosed herein and the claims that follow.

What is claimed is:

1. An integrated circuit comprising:
a substrate;
an active layer comprising a plurality of active regions formed from the substrate; and
a gate material layer comprising a plurality of trimmed gate material gratings formed in relation to the active layer such that intersections of the plurality of trimmed gate material gratings and the plurality of active regions define transistors of a plurality of memory devices and a plurality of logic devices,
wherein at least one of a group consisting of the plurality of active regions in the active layer and the plurality of trimmed gate material gratings in the gate material layer are arranged according to a common grating pattern of the plurality of memory devices and the plurality of logic devices.

2. The integrated circuit of claim 1 wherein the common grating pattern is optimized for memory.

3. The integrated circuit of claim 1 wherein the plurality of active regions in the active layer are arranged according to a common grating pattern for both the plurality of memory devices and the plurality of logic devices for the active layer.

4. The integrated circuit of claim 3 wherein the common grating pattern for both the plurality of memory devices and the plurality of logic devices for the active layer comprises a plurality of gratings, and a width of each of the plurality of gratings and a pitch of the plurality of gratings is optimized for memory.

5. The integrated circuit of claim 3 wherein the plurality of active regions in the active layer are arranged according to the common grating pattern for both the plurality of memory devices and the plurality of logic devices for the active layer and a common trim pattern for both the plurality of memory devices and the plurality of logic devices for the active layer.

6. The integrated circuit of claim 5 wherein the plurality of active regions in the active layer are formed by trimming the common grating pattern for both the plurality of memory devices and the plurality of logic devices for the active layer based on the common trim pattern to provide a common trimmed grating pattern and processing the substrate based on the common trimmed grating pattern to define the plurality of active regions.

7. The integrated circuit of claim 5 wherein the gate material layer is formed from a plurality of gate material gratings having a common grating pattern for both the plurality of memory devices and the plurality of logic devices.

8. The integrated circuit of claim 7 wherein a width of each of the plurality of gate material gratings and a pitch of the plurality of gate material gratings is optimized for memory.

9. The integrated circuit of claim 7 wherein the plurality of trimmed gate material gratings of the gate material layer are formed by trimming the plurality of gate material gratings based on different trim patterns for the plurality of memory devices and the plurality of logic devices for the gate material layer.

10. The integrated circuit of claim 3 wherein the plurality of active regions in the active layer are arranged according to the common grating pattern for both the plurality of memory devices and the plurality of logic devices for the active layer and different trim patterns for the plurality of memory devices and the plurality of logic devices for the active layer.

11. The integrated circuit of claim 10 wherein the active layer is formed by trimming the common grating pattern for both the plurality of memory devices and the plurality of logic devices for the active layer based on the different trim patterns for the plurality of memory devices and the plurality of logic devices to provide a trimmed grating pattern for memory and a trimmed grating pattern for logic, and processing the substrate based on the trimmed grating pattern for memory and the trimmed grating pattern for logic to define the plurality of active regions.

12. The integrated circuit of claim 10 wherein the gate material layer is formed from a plurality of gate material gratings having a common grating pattern for both the plurality of memory devices and the plurality of logic devices.

13. The integrated circuit of claim 12 wherein a width of each of the plurality of gate material gratings and a pitch of the plurality of gate material gratings is optimized for memory.

14. The integrated circuit of claim 12 wherein the plurality of trimmed gate material gratings of the gate material layer are formed by trimming the plurality of gate material gratings based on different trim patterns for the plurality of memory devices and the plurality of logic devices for the gate material layer.

15. The integrated circuit of claim 1 wherein the gate material layer is formed from a plurality of gate material gratings having a common grating pattern for both the plurality of memory devices and the plurality of logic devices.

16. The integrated circuit of claim 15 wherein a width of each of the plurality of gate material gratings and a pitch of the plurality of gate material gratings is optimized for memory.

17. The integrated circuit of claim 15 wherein the plurality of trimmed gate material gratings of the gate material layer are formed by trimming the plurality of gate material gratings based on different trim patterns for the plurality of memory devices and the plurality of logic devices for the gate material layer.

18. The integrated circuit of claim 15 wherein the plurality of active regions are formed according to a common pattern for the plurality of memory devices and the plurality of logic devices.

19. The integrated circuit of claim 15 wherein the plurality of active regions are formed according to different patterns for the plurality of memory devices and the plurality of logic devices.

20. The integrated circuit of claim 1 further comprising:
a contact layer comprising one or more contacts formed over the gate material layer; and
one or more metal layers comprising on-chip interconnects,
wherein the on-chip interconnects of at least one of the one or more metal layers are arranged according to a common grating pattern for the plurality of memory devices and the plurality of logic devices.

21. A method of fabricating an integrated circuit comprising:
forming an active layer comprising a plurality of active regions from a substrate; and
forming a gate material layer comprising a plurality of trimmed gate material gratings formed in relation to the active layer such that intersections of the plurality of trimmed gate material gratings and the plurality of active regions define transistors for a plurality of memory devices and a plurality of logic devices,
wherein at least one of a group consisting of the plurality of active regions in the active layer and the plurality of trimmed gate material gratings in the gate material layer are arranged according to a common grating pattern of the plurality of memory devices and the plurality of logic devices.

* * * * *